United States Patent [19]

Williams

[11] Patent Number: 4,574,249

[45] Date of Patent: Mar. 4, 1986

[54] NONINTEGRATING LIGHTWAVE RECEIVER

[75] Inventor: Gareth F. Williams, Summit, N.J.

[73] Assignee: AT&T Bell Laboratories, Murray Hill, N.J.

[21] Appl. No.: 718,712

[22] Filed: Apr. 1, 1985

Related U.S. Application Data

[62] Division of Ser. No. 300,376, Sep. 8, 1981.

[51] Int. Cl.[4] .............................................. H01J 40/14
[52] U.S. Cl. ...................................... 330/59; 455/619; 250/214 AG; 330/284
[58] Field of Search ................. 330/59, 278, 279, 282, 330/284; 455/619; 250/214 AG

[56] References Cited

U.S. PATENT DOCUMENTS 4,048,573 9/1977 Evans et al. .......................... 330/279
4,415,803 11/1983 Muoi ................................... 330/284

FOREIGN PATENT DOCUMENTS 2096852A 10/1982 United Kingdom .

OTHER PUBLICATIONS

"An Optical Repeater with High Impedance Input Amplifier" *The Bell System Technical Journal*, vol. 53, No. 4, Apr. 1974, pp. 629–643, J. E. Goell.

"p-i-n/F.E.T. Hybrid Optical Receiver for Longer-Wavelengths Optical Communication Systems", *Electronics Letters*, vol. 16, No. 2, Jan. 17, 1980, pp. 69–71, D. R. Smith et al.

"Optical Detector Package", *The Bell System Technical Journal*, vol. 57, No. 6, Jul.–Aug. 1978, pp. 1809–1822, R. G. Smith et al.

"GaAs F.E.T. Transimpedance Front-End Design for a Wideband Optical Receiver", *Electronics Letters*, vol. 15, 1979, pp. 650–652, K. Ogawa et al.

"Bi-FET Op Amps Simplify AGC Threshold Design" *Designer's Casebook, Electronics*, Apr. 21, 1981, vol. 54, No. 7, John H. Davis.

*Primary Examiner*—James B. Mullins
*Assistant Examiner*—G. Wan
*Attorney, Agent, or Firm*—Michael J. Urbano

[57] ABSTRACT

A nonintegrating, high sensitivity, wide dynamic range receiver is described. A voltage dependent current source is connected in negative feedback with a forward voltage amplifier. The transconductance of the current source is essentially independent of frequency within the signal bandwidth frequency, and the feedback pole is the dominant pole in the loop gain. To prevent saturation by high intensity input signals the receiver is combined with a range extender circuit.

4 Claims, 51 Drawing Figures

$R_e = R_F/A+1$ $C_T + (A+1)C_R$

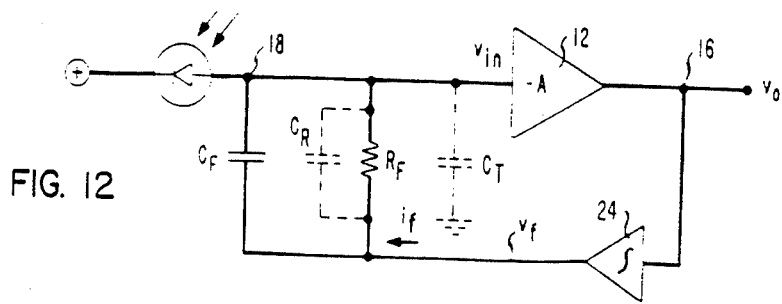
FIG. 12
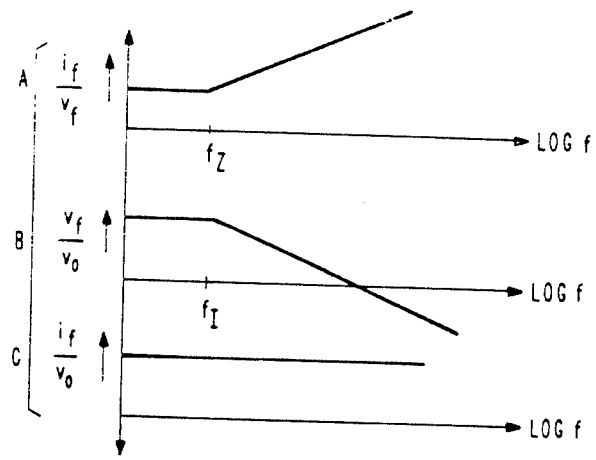
FIG. 13
FIG. 14
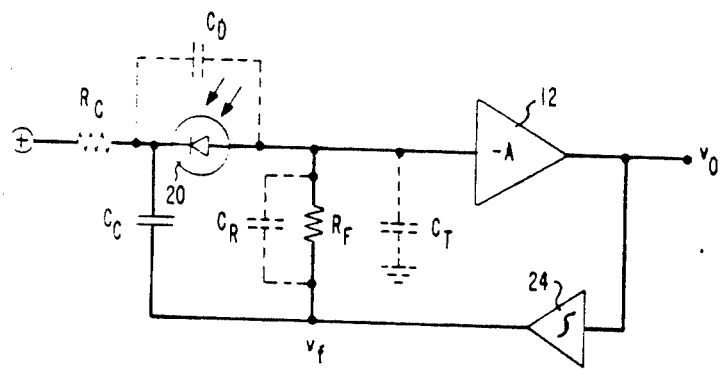

CIRCUIT SYMBOL

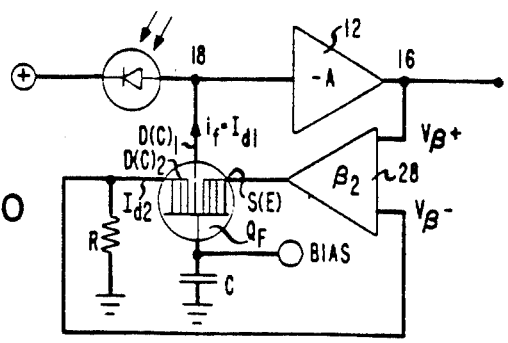
FIG. 30
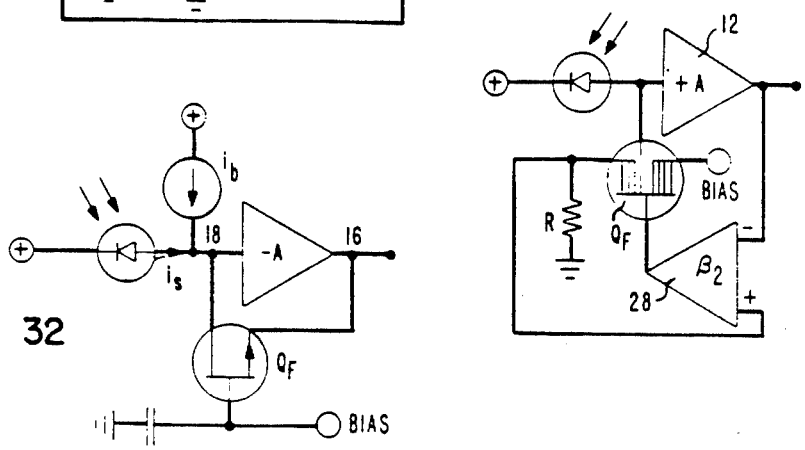
FIG. 31
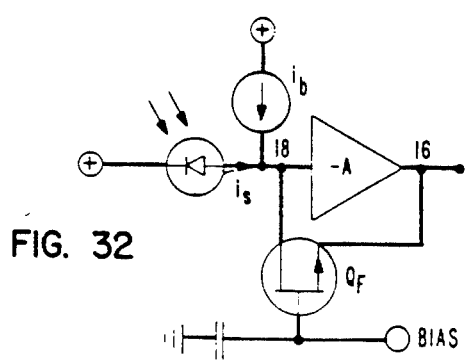
FIG. 32
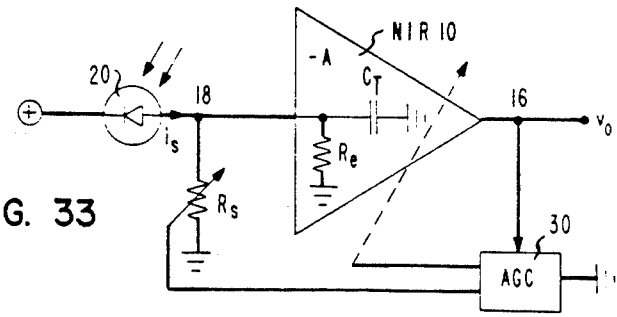
FIG. 33
FIG. 34
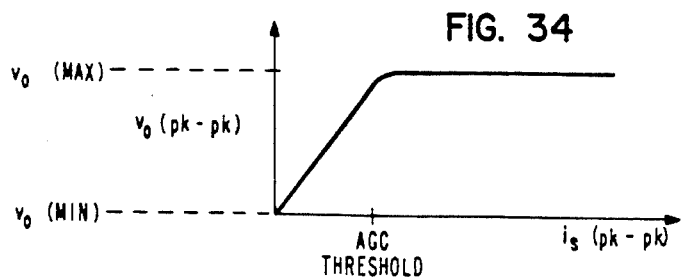

NONINTEGRATING LIGHTWAVE RECEIVER

This application is a divisional of copending application Ser. No. 300,376, filed on Sept. 8, 1981.

I. BACKGROUND OF THE INVENTION

This invention relates to receivers of electrical or optical signals, whether encoded in a digital or analog format, and more particularly to nonintegrating, high sensitivity, wide dynamic range optical receivers.

II. PRIOR ART

A generalized schematic of a prior art optical receiver is shown in FIG. 1. A photodiode is connected between a source of reverse bias voltage and the input of a voltage amplifier, and a load resistor $R_L$ is connected between the input and ground. The photodiode current $i_s$ develops a voltge $v_{in}$ across the load resistor $R_L$. This voltage is then amplified by a factor A in the amplifier and appears at its output as $v_o$. If the frequency response of A is flat, then ideally $v_o = -AR_L i_s$ and the photocurrent-to-output voltage response will be flat too.

One problem with this type of receiver is that for good sensitivity $R_L$ should be large enough so that its Johnson noise current, which is proportional to $R_L^{-\frac{1}{2}}$, is small compared to the minimum achievable equivalent amplifier input noise current. As a consequence, the photocurrent $i_s$ is integrated by the amplifier input capacitance $C_A$ plus the parasitic photodiode capacitance $C_D$ as shown in the equivalent circuit of FIG. 2. For present 45 Mb/s digital receivers, $R_L$ should be $\geq 1$ M$\Omega$ for high sensitivity, but since typically $C_D + C_A = C_T$ 1 pF, the transfer function of the amplifier typically has an input current-to-voltage pole at a frequency $$f_p = \frac{1}{2\pi R_L C_T} = 160 \text{ kHz}.$$

Above 160 kHz the photocurrent is integrated by $C_T$. Thus, the output signal is integrated even though the voltage gain A is flat.

Accordingly, in the prior art to reconstruct the signal the output voltage $v_o$ is differentiated by an equalizer, as shown in FIG. 3, which has a zero in its transfer function at a frequency equal to the input pole frequency $f_p$. Waveforms for the circuit of FIG. 3 are shown in FIG. 4 wherein it should be noted that the average input voltage $v_{in}$ is the average signal current $i_s$ times $R_L$. This equalization technique introduces a noise penalty because the equalizer attenuates the signal. For a digital signal the peak attenuation is the equalization ratio $I_2 B/f_p$, where $I_2$ is the second Personick integral and B is the bit rate. For the example above in which $B=44.7$ Mb/s, $I_2 B/f_p = 25$ MHz/160 kHz$=156:1$. This attenuation enhances the noise of stages following the equalizer, resulting in an equalizer noise penalty.

In theory, this equalizer noise penalty could be reduced by increasing the gain A of the amplifier. However, for a random bit stream (which allows for maximum information content in the digital signal), increasing A reduces the photocurrent for which saturation of the integrating amplifier causes an unacceptable bit error rate. This saturation occurs when long strings of all logic 1's or all logic 0's are received and reduces the dynamic range. Even with zero dynamic range, which occurs when the maximum input power is equal to the sensitivity level, the noise penalty is still appreciable at high bit rates (e.g., $\geq 100$ Mb/s).

Another tradeoff between dynamic range and sensitivity is involved in choosing $R_L$. A high $R_L$ improves sensitivity by reducing the input Johnson noise current, but for the random bit stream increases the probability of saturation on long strings of pulses because the integration pole frequency $f_p$ is lower. In contrast, although a low $R_L$ increases $f_p$ and improves dynamic range, it also reduces sensitivity by increasing the Johnson noise current.

Both sensitivity and dynamic range problems have been somewhat alleviated in the prior art by encoding the data stream to limit the number of consecutive 1's or 0's. However, this technique is disadvantageous because the data stream is restricted; i.e., more bits must be used to transmit the same amount of information, resulting in an equivalent encoding sensitivity penalty. In addition, extra equipment is required: an encoder in the transmitter and a decoder in the receiver.

Other prior art receivers incorporate a transimpedance amplifier of the type shown in FIG. 5. In this amplifier, a feedback resistor $R_F$ is connected between the input and output in order to move the amplifier pole $f_p$ above the passband. For the circuit of FIG. 5, the feedback current $i_f$ flowing in $R_F$ is $$i_f = \frac{V_{in} - V_o}{R_F} = \frac{v_{in}(1 + A)}{R_F}. \quad (2.1)$$

The equivalent input resistance $R_E$ of the amplifier is $$R_e = \frac{v_{in}}{i_f} = \frac{R_F}{1 + A} \quad (2.2)$$

and the input pole frequency is $$f_p = \frac{A + 1}{2\pi R_F C_T}. \quad (2.3)$$

where, as before, $C_T = C_D + C_A$. Thus, the transimpedance feedback configuration ideally increases $f_p$ by a factor of the gain A plus one. In order to not integrate the signal and to eliminate the equalizer and its associated noise penalty, the pole frequency $f_p$ should be moved above the passband.

Notwithstanding, however, prior art high-sensitivity transimpedance amplifiers still integrate the photocurrent signal because a parasitic feedback capacitance $C_R$ shunts the resistor $R_F$ as shown in FIGS. 7 and 8. For frequencies greater than $\frac{1}{2}\pi R_F C_R$ the feedback resistor's admittance is primarily capacitive and the signal is integrated. In the best of these amplifiers, $C_R \approx 0.05$ pF and for the 45 Mb/s case discussed earlier take $R_F = 1$ M$\Omega$. Then, the amplifier integrates the signal above 3.2 MHz. Consequently, equalization is still required, although the equalization ratio is typically 10–20 times less than for the simple receiver of FIG. 1. The equalizer noise penalty and the dynamic range/sensitivity tradeoffs are correspondingly improved.

Although the equalizer noise penalty is reduced, it is still a problem at high bit rates where the equalization ratio, hence attenuation, is greatest. In fact, at 420 Mb/s, the noise of the post-amplifier (not shown), which would follow the equalizer in FIG. 3, is expected to be dominant.

Finally, even if encoding is used, the maximum photocurrent is still restricted by the DC voltage drop across $R_F$. For the 45 Mb/s case cited, this corresponds to $i_s \approx 2$ to 4 $\mu$A, or a dynamic range of about 22 dB. Thus, the best known prior art receiver dynamic range still requires the use of field installed attenuators.

III. SUMMARY OF THE INVENTION

It is one object of my invention to provide a high sensitivity receiver which does not integrate the signal and which, therefore, requires no differentiating equalizer with its associated noise penalty.

It is a second object of my invention to provide a nonintegrating receiver which has a wide dynamic range. In a fiber optic system, this receiver needs no field installed attenuators to accommodate different length optical fibers, as do prior art integrating receiver amplifiers. Ideally, this receiver will not saturate even if driven by relatively high power laser transmitters. Thus, the expense, inconvenience, and reliability problems of field installed attenuators are eliminated.

It is a third object of my invention to provide a highly sensitive digital receiver which requires no encoding of the data stream in order to enhance sensitivity and/or dynamic range.

It is a fourth object of my invention to provide such an amplifier which can be advantageously realized in NMOS or GaAs integrated circuit form. Fabrication as an integrated circuit offers improved sensitivity via reduction of front end capacitance; in addition, NMOS fabrication allows the integration of other receiver and system functions on the same chip. The resultant cost improvement is important for data and video link applications, and the reliablity improvement is of importance in submarine cable systems.

Accordingly, my invention is a high sensitivity, wide dynamic range, nonintegrating receiver for amplifying a signal current $i_s$, which may be either digital or analog, and for producing an output voltage $v_o$. The receiver includes a voltage amplifier having a forward voltage gain (A) with n (n=1,2 ...) poles therein at frequencies $f_{ai}$ (i=1,2, ... n) outside the bandwidth of the signal. A negative feedback circuit, connected between the input and output of the amplifier, includes a current source for generating a feedback current $i_f$ which is proportional to $v_o$ and which is subtracted from $i_s$. In addition, the transconductance $g_f$ of the current source is essentially independent of frequency within the bandwidth of the signal and is of opposite sign to A. The feedback circuit in combination with the input capacitance $C_T$ of the receiver produces a feedback voltage gain $\beta$ with a feedback pole therein at a frequency $f_f$, which is preferably within $\Delta f$. One feature of my invention is that the feedback pole is the dominant pole in the frequency response of the loop gain A$\beta$. Another feature is that the transimpedance pole $f_p$ of the receiver is equal to the unity loop gain frequency $f_u$. For stability $f_p = f_u$ should be sufficiently below the voltage amplifier poles $f_{ai}$ so that the total voltage phase shift around the loop is less than 360 degrees.

The output impedance of the current source is very high so as to reduce Johnson noise and hence produce high sensitivity. However, the resulting effective input admittance, $Ag_f + j\omega C_T$, of the amplifier with feedback is primarily conductive over the signal bandwidth so that the input signal is not integrated and saturation on long strings of pulses does not occur.

In the case of a non-return-to-zero (NRZ) digital signal having a bit rate B and a bandwidth $\frac{1}{2}B$, the following inequality should be satisfied for the receiver to be nonintegrating: $Ag_f > 2\pi C_T \frac{1}{2} B$.

In one embodiment of my invention, the current source includes a voltage integrator driving the parallel combination of a feedback resistor and capacitor mutually adapted so that the resistor-capacitor combination has a zero in its voltage-to-current transfer function which cancels the pole in the transfer function of the integrator.

In another embodiment of my invention, the current source includes a field effect transistor (FET) which has its source and drain connected between the input and output of the amplifier and which is biased in the linear region of its current-voltage characteristic. In one variant of this embodiment the FET is designed to have a resistive gate so that two different gate voltages can be applied thereto, one a gate-to-source voltage and the other a gate-to-drain voltage. These voltages are mutually adapted with the FET threshold voltage so that the gate-to-channel voltage above threshold is essentially uniform along its length, thereby making the resistivity of the channel essentially uniform along its length.

Alternatively, the transistor (either an FET or bipolar device) may be biased into saturation, but then a linearizing circuit is used to drive the transistor to make the feedback current $i_f$ a linear function of $v_o$.

As mentioned above, my receiver is nonintegrating and so will not saturate on long strings of pulses in a digital signal. Nevertheless, if the signal current $i_s$ reaches sufficiently high amplitudes, the amplifier may still saturate. Therefore, in another embodiment of my invention the dynamic range of my receiver is extended by means of a variable resistor $R_s$ connected to the input of the amplifier and an automatic gain control (AGC) circuit responsive to the input or output signal for decreasing $R_s$ when the input current reaches too high a level. Various configurations of the range extender are contemplated: $R_s$ connected in shunt or in feedback with the amplifier; AGC control of the gain (A) of the forward amplifier as well as the resistance of $R_s$; and variable capacitors in parallel with $R_s$ and under AGC control for stability reasons.

BRIEF DESCRIPTION OF THE DRAWING

My invention, together with its various objects, features and advantages, can be readily understood from the following more detailed description taken in conjunction with the accompanying drawing, in which:

FIG. 12 shows an optical receiver in accordance with one embodiment of my invention in which the current source of FIG. 9 is realized by capacitance-resistive feedback and integration of the output voltage;

FIG. 13, Parts A–C, show various frequency response graphs for the receiver of FIG. 12;

FIG. 14 shows another version of the receiver of FIG. 12 in which $C_C \gg C_D$ and $R_C C_C \gg R_F(C_D + C_R)$

FIGS. 30 and 31 show circuits incorporating minor loop feedback for linearization in accordance with yet other embodiments of my invention;

FIG. 32 shows an optical receiver in accordance with another embodiment of my invention in which the current source of FIG. 9 is realized by a saturated transistor $Q_F$ in combination with suitable current prebias to achieve linearization;

FIG. 33 shows the optical receiver of FIG. 9 in combination with a range extender formed by a variable shunt resistor $R_s$ and an AGC circuit responsive to the output voltage $V_o$;

FIG. 34 is a graph depicting an illustrative AGC function;

III. DETAILED DESCRIPTION

III(a) General Nonintegrating Receiver

This section describes various embodiments of high sensitivity, nonintegrating receivers (NIRs) in accordance with my invention; section IV describes range-extender/AGC circuits which may be added to these NIRs to improve their dynamic range. These NIRs are also more sensitive than the integrating receivers of the prior art because the equalizer and its associated noise penalty are eliminated. In addition, the dynamic range extender circuits permit these NIRs to be optimized solely for sensitivity, eliminating the need for tradeoffs between dynamic range and sensitivity.

For purposes of illustration, and in the interests of simplicity, a receiver for detecting and amplifying digital optical signals will be described. It will be apparent, however, that analog as well as digital signals and optical as well as non-optical signals, can be amplified by the receivers of my invention.

Figure 9:
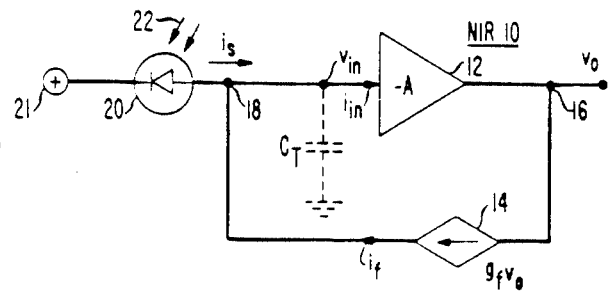
FIG. 9 shows an optical receiver in accordance with a general embodiment of my invention.

A schematic of a general high sensitivity, nonintegrating optical receiver NIR 10 in accordance with my invention is shown in FIG. 9. The receiver comprises a voltage amplifier 12 having a forward voltage gain $(-A)$; i.e., the amplifier 12 inverts the output voltage $v_o$ with respect to the input voltage $v_{in}$. A feedback circuit (current source 14) is coupled between the output and input terminals 16 and 18 of amplifier 12 in a negative feedback connection. The current source has a transconductance $g_f$ which is independent of frequency and produces a feedback current $i_f$ which is proportional to the output voltage $v_o$. A photodetector 20 is connected between the input terminal 18 and a source 21 of reverse bias voltage. Photodetector 20, typically a photodiode, converts the digital optical radiation 22 to a corresponding digital photocurrent $i_s$.

For high sensitivity, a high impedance feedback circuit is required in order to reduce Johnson noise. Consequently, the feedback circuit is a current source 14, as shown. For a nonintegrating response, the loop gain is sufficiently high that the feedback current $i_f$ is nearly equal to the photocurrent $i_s$. Thus, if the feedback current is proportional to the output voltage $v_o$, the output voltage is proportional to the signal current $i_s$, giving the desired nonintegrating transimpedance response. More specifically, although the feedback loop and $C_T$ are integrating, because the forward gain is negative, $i_f$ is negative with respect to $i_s$. If A is high enough then $g_f v_o = i_f \approx i_s$, and only a small difference current $i_{in}$ flows in $C_T$ so that $v_{in}$ is proportional to $i_s$ and the receiver is, therefore, nonintegrating. Looked at another way, the gain A should be large enough so that equivalent resistance $R_e = 1/Ag_f$ is smaller than the impedance of $C_T$ even at the upper end of the passband. Then, most of $i_s$ will flow through $R_e$ rather than $C_T$. Consequently, the equivalent input impedance is resistive and the signal is not integrated.

For stability, the poles $f_{ai}$ of amplifier 12 are outside the signal bandwidth $\Delta f$, whereas the feedback circuit pole $f_f$ is the dominant pole in the loop gain response. In addition, it will be shown analytically that the transimpedance pole $f_p$ of the receiver is equal to the unity gain frequency $f_u$ (i.e., the frequency at which the loop voltage gain equals one).

Figure 10:
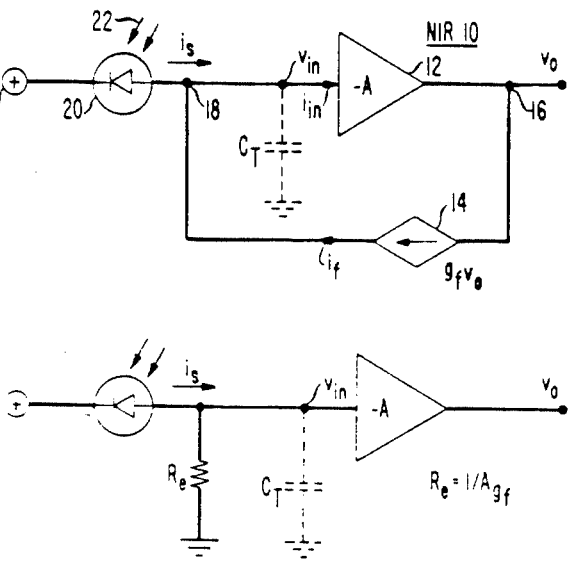
FIG. 10 is an equivalent circuit for FIG. 9.

The analysis of the NIR 10 which demonstrates these features is as follows. The feedback current $i_f$ is given by $$i_f = g_f v_o = -Ag_f v_{in}, \tag{3.1}$$

which permits an equivalent input resistance $R_e$ for amplifier 12 to be defined;

$$R_e = \frac{v_{in}}{i_f} = 1/(Ag_f), \tag{3.2}$$

assuming the gain A is flat (i.e., constant with frequency). $R_e$ is in parallel with the total receiver input capacitance $C_T = C_D + C_A$ (FIG. 10), where $C_D$ is the parasitic capacitance of the photodiode 20 and $C_A$ is the input capacitance of amplifier 12. Thus, the current-to-voltage (transimpedance) response of the receiver (FIG. 11E) has a pole at $$f_p = \tfrac{1}{2}\pi R_e C_T = Ag_f/2\pi C_T. \tag{3.3}$$

For a nonintegrating response, this pole must be above the signal bandwidth $\Delta f$. For example, for a non-return-to-zero (NRZ) digital signal, the Nyquist bandwidth is about half the bit rate B. Setting $f_p \geq B$ provides a generous safety factor and from equation (3.3) gives $$Ag_f > 2\pi C_T B. \tag{3.4}$$

Thus, the product $Ag_f$ of the amplifier gain and feedback transconductance for a nonintegrating current-to-voltage response is proportional to the total input capacitance times the bit rate.

Figure 11:
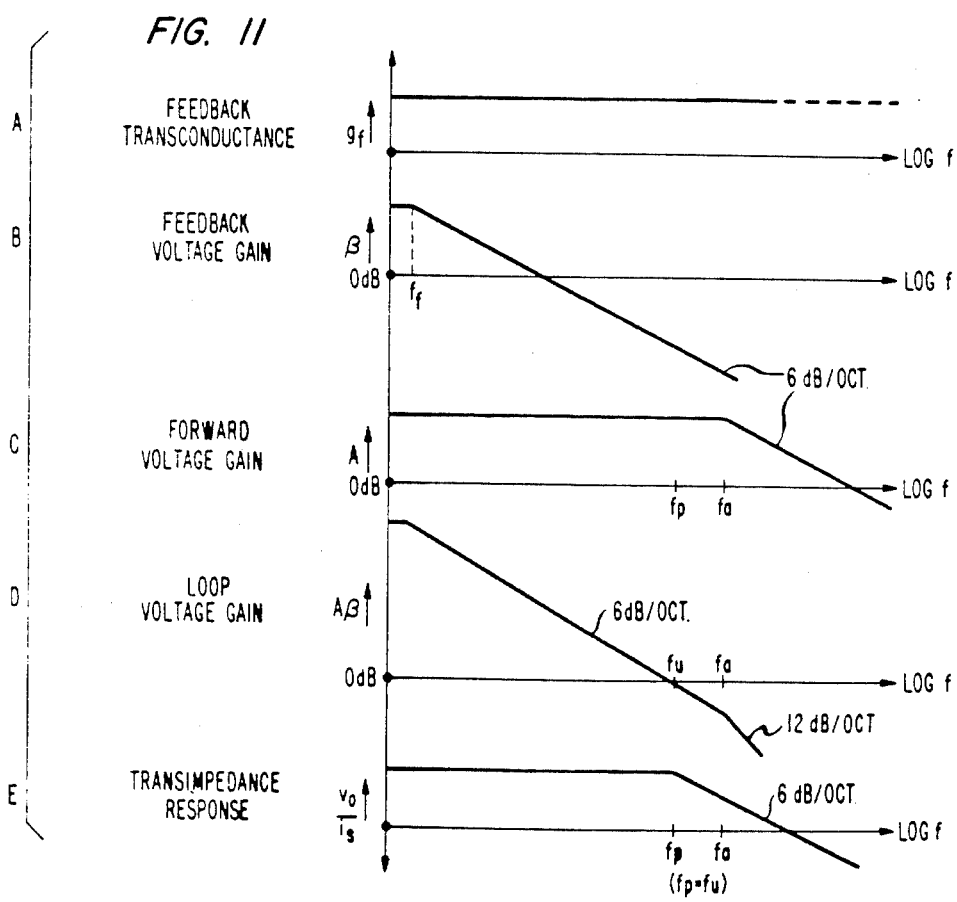
FIG. 11, Parts A-E, show various frequency response graphs for the receiver of FIG. 9.

Stability considerations also require the poles in the forward voltage gain A to be above the passband. Whereas the transconductance response, discussed above, was determined by current feedback, the stability is determined by the loop voltage gain. The current feedback into the input capacitance $C_T$ produces an integrating feedback voltage gain $\beta$, hence a 90-degree phase shift (FIG. 11B). For low Johnson current noise, the output resistance of current source 14 must be large; thus, the pole in $\beta$ is at a low frequency $f_f$ and must be used as the dominant loop pole. If we neglect the poles in A (FIG. 11C), which are assumed to be at high frequencies $f_{ai}$, the overall loop voltage gain $A\beta$, shown in FIG. 11D, is $$-A\beta = \frac{-Ag_f}{C_T s} = \frac{-Ag_f}{j2\pi f C_T}. \tag{3.5}$$

The unity voltage loop gain frequency $f_u$ (where $A\beta = 1$) is then $$f_u = Ag_f/2\pi C_T. \tag{3.6}$$

A surprising result is that the unity loop gain frequency $f_u$ is equal to the current-to-voltage response pole frequency $f_p$ given by Eqn. 3.3. For a phase margin greater than 45 degrees, the lowest frequency pole in A must be greater than $f_u$. But, $f_u$ is equal to $f_p$, which is chosen equal to the upper frequency limit of the passband. Thus, the poles in the forward gain A must be above the passband.

Accordingly, for the NIRs in accordance with my invention, the recommended transimpedance pole frequency $f_p$ (or unity loop gain frequency $f_u$) is typically set about equal to the bit rate; the required bandwidth of amplifier 12 is only somewhat greater. The preferred equivalent input resistance $R_e$ is determined by $C_T$ and B as given by Eqn. 3.2, regardless of the type of feedback current source used.

III(b). Capacitive Feedback Transimpedance Receiver

In this embodiment of my invention, shown in FIG. 12, the current source 14 of FIG. 9 is realized by the parallel combination of a capacitor $C_F$ and a resistor $R_F$ which is driven by a voltage integrator 24. $C_F$ and $R_F$ are connected between input terminal 18 and the output of integrator 24 which derives its input from $v_o$ at output terminal 16. At low frequencies the feedback provided by the combination of $R_F$ and $C_F$ is resistive, but over most of the bandwidth the feedback is capacitive;

that is, in presently available hybrid integrated circuit (HIC) technology a large value feedback resistor is dominated by its parasitic shunt feedback capacitance $C_R$ shown in phantom. For the 44.7 Mb/s transimpedance amplifier example given in Section II, $R_F$ was 1 MΩ and $C_R$ was 0.05 pF. These parameter values give rise to a current-feedback zero frequency at 3.2 MHz above which the feedback is primarily capacitive. Thus, the capacitive feedback circuit is preferred for HIC high sensitivity NIRs.

As discussed with respect to current source 14, the feedback current $i_f$ should be proportional to the output voltage $v_o$ in order to obtain a nonintegrating current-to-voltage response. For capacitance feedback, the feedback current is the derivative of the feedback voltage. So, if the feedback voltage $v_f$ is the integral of the output voltage, then the feedback current $i_f$ is proportional to the output voltage, as desired. To achieve a non-integrating response, the feedback integrator 24 should be designed to introduce a pole which cancels the $R_F$-$C_F$ current feedback zero (FIG. 13A). More explicitly, the voltage-to-current transfer function of $R_F$-$C_F$ produces a zero at a frequency $f_F = \frac{1}{2\pi\tau_F}$ and is given by $$i_f = v_f\left(\frac{1}{R_F} + C_F s\right) = v_F C_F(s + \tau_F^{-1}); \tau_F = R_F C_F. \quad (3.7)$$

The feedback integrator response produces a pole at a frequency $f_I$ (FIG. 13B) and is given by $$v_f = \frac{a v_o}{s + \tau_I^{-1}}, \text{ where } \tau_I = 2\pi f_I. \quad (3.8)$$

If $\tau_I = \tau_F = \tau$, then the transconductance $g_f$ of current source 14 is derived from combining Eqn. 3.7 and Eqn. 3.8:

$$g_f = \frac{i_f}{v_o} = \left[C_F(s + \tau^{-1})\frac{a}{(s+\tau)^{-1}}\right] = aC_F; \quad (3.9)$$

i.e., the pole at $f_I$ cancels the zero at $f_F$, and the feedback conductance is constant with frequency as desired. (Note that $$v_f = a\int v_o \, dt;$$

thus, a has dimensions of inverse seconds, and $aC_T$ is a conductance, as required.)

The other requirement of section IIIa for a nonintegrating response to an NRZ digital signal is that the equivalent input conductance $g_e$ due to the current feedback be greater than the admittance of the receiver input capacitance $C_T$ at the upper end of the passband (Eqn. 3.4); to wit, $$Ag_f = A(aC_F) > 2\pi C_T B, \text{ or} \quad (3.10)$$

$$Aa > \frac{2\pi C_T}{C_F} B.$$

Thus, the minimum product Aa of forward gain A and feedback integrator constant a is proportional to $C_T/C_F$. Thus, increasing the feedback capacitance $C_F$ decreases the amount of gain required.

One way to increase $C_F$ and hence decrease the required gain is simply to connect an extra capacitance across $R_F$. In some cases, the sensitivity penalty associated with this increase in front-end capacitance is acceptable. The advantage is that $R_F C_F = \tau_F$ is accurately known; thus no adjustment of the feedback integrator pole $\tau_I$ is needed to insure pole-zero cancellation as in Eqn. 3.9. This approach may be used for very high frequency integrated circuit amplifiers to decrease the required loop gain.

The preferred approach, shown in FIG. 14, is to AC couple the photodiode junction capacitance $C_D$ across $R_F$ by connecting the bias side of the photodiode 20 to the output $v_f$ of the feedback integrator 24 through a large capacitor $C_c$. No extra capacitance is added to the front end and there is no sensitivity penalty. Furthermore, in practice, $C_D \frac{1}{3} C_T$. Thus, $C_D$ is the lowest possible feedback impedance at the upper end of the passband so that the high frequency loop gain required is the lowest of any of the NIR designs herein. For $C_D = 0.4$ pF and $f = B = 44.7$ Mb/s the impedance of $C_c$ is j8.9 kΩ. For $C_T = 1.3$ pF and $C_D = 0.5$ pF, the required gain product (Eqn. 3.10) at the bit rate is only $$\frac{Aa}{2\pi B} = \frac{C_T}{C_F} = 2.6. \quad (3.10a)$$

Figure 15:
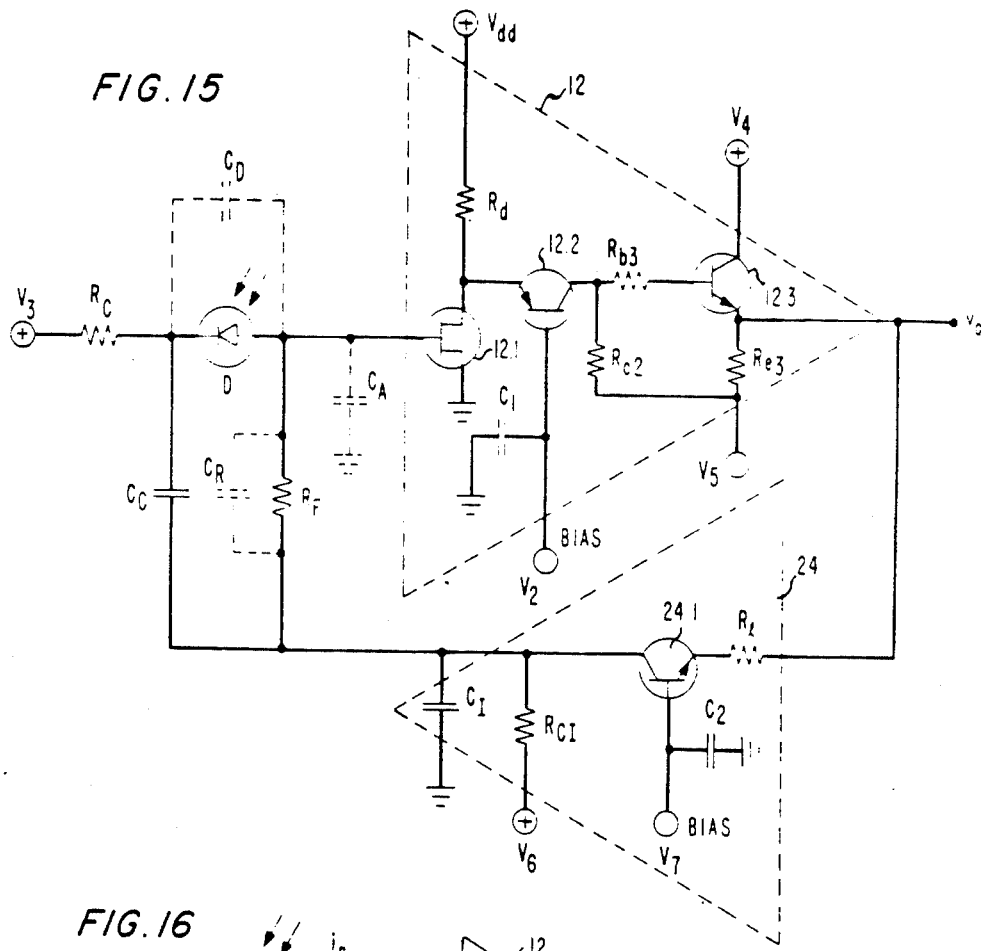
FIG. 15 is a circuit schematic of the receiver of FIG. 14 with well-known bypass and filtering components omitted in the interests of simplicity; and in which $R_F(C_D + C_R) = R_C C_F$.

A practical 44.7 Mb/s NIR receiver is shown in FIG. 15 where well-known bypass and filtering components are not shown in the interests of simplicity. The forward amplifier 12 was a conventional cascode arrangement of an FET 12.1 and bipolar junction transistor (BJT) 12.2 with a voltage gain of approximately 25. The feedback integrator 24 was a common-base BJT 24.1 with an extra capacitor $C_I$ on the collector to provide the integration pole $\pi_I = R_{CI} C_I$. Because cascode stages are broadband, and the gain at the bit rate was only ~0.1, the feedback integrator's other poles were above 500 MHz and did not affect stability.

The stability criteria are exactly those discussed in section III(a). This circuit is stable because the pole due to the current feedback into $C_T$ rolls the loop voltage gain down through unity before the first amplifier gain pole $f_a$. An equivalent viewpoint is that at high frequency $C_F$ and $C_T$ form a 2.6:1 voltage divider from the integrator output to the amplifier input, and that the 6 dB/octave integrator rolloff carries the loop voltage gain down through unity.

III(c). Resistive FET Feedback Receiver

Figure 16:
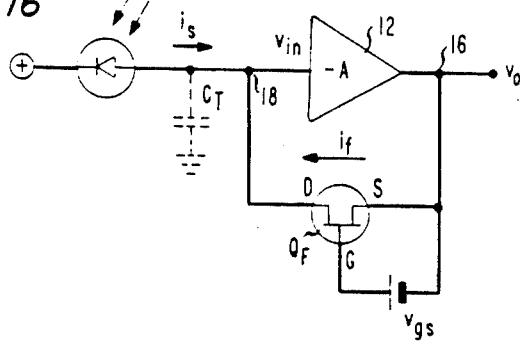
FIG. 16 shows an optical receiver in accordance with another embodiment of my invention in which the current source of FIG. 9 is realized by an FET ($Q_F$) biased into the linear region of its I–V characteristic.

In this embodiment of my invention, shown in FIG. 16, the current source 14 of FIG. 9 is realized by a specially designed FET $Q_F$ having its drain and source connected to the input and output terminals 18 and 16, respectively, of amplifier 12. A bias voltage source $V_{gs}$, illustratively depicted as a battery, is connected between the source and gate of $Q_F$. Although an n-channel FET is depicted a p-channel device would also be suitable.

This circuit is a form of transimpedance amplifier in which the feedback resistor is an FET $Q_F$ operating in the linear portion of its drain-voltage vs. drain current characteristic. The stability and transimpedance response considerations, however, are essentially those described in section III(a) for the general circuit of FIG. 9, with $g_f$ being the drain-to-source conductance $g_{sd}$ of $Q_F$. For $v_o >> v_{in}$ (i.e., $A >> 1$), $Q_F$ is a good current source. Thus, from Eqn. 3.4 the minimum forward gain A of amplifier 12 for a nonintegrating response of a digital signal is approximately $$A > \frac{2\pi C_T B}{g_f}, \quad g_f = g_{sd}, \quad (3.11)$$

where it is assumed that the transimpedance bandwidth is equal to the bit rate B. Similarly, for stability, the poles in the gain A of amplifier 12 should be above the passband, as discussed earlier.

The design of a suitable feedback FET $Q_F$ is important to the implementation of this embodiment of my invention. The first problem is to realize a large enough source-to-drain resistance $R_{sd}$ to reduce the Johnson noise. Simple reduction of the gate bias voltage $V_{gs}$ to increase $R_{sd}$ can cause a linearity problem if the resultant drain current saturation voltage is not sufficiently greater than the maximum source-to-drain voltage across $Q_F$. Now, the voltage $V_{sd}$ at which drain current saturates is approximately the gate voltage above threshold, $\Delta V_{gs} = V_{gs} - V_t$, while the source-to-drain voltage $V_{sd}$ is simply the output signal voltage $-i_s R_{sd}$ since $i_f \sim -i_s$. The ratio of these two voltages determines the linearity of $R_{sd}$, hence the transimpedance gain linearity. Thus, the minimum gate voltage above threshold is determined by the transimpedance linearity requirement and the product of $R_{sd}$ times the maximum input photocurrent. In embodiments discussed in section IV, infra, the maximum $i_s$ is determined by the dynamic range extender circuit described there. In FET design $R_{sd}$ should be equal to or greater than the required feedback resistance at this minimum gate voltage.

Figure 17:
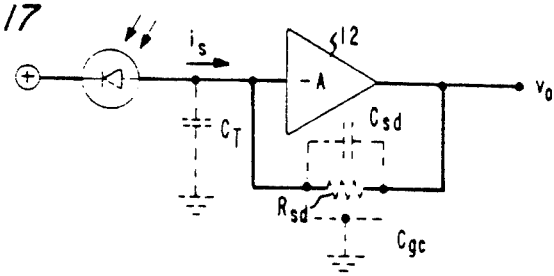
FIG. 17 shows the receiver of FIG. 16 with an equivalent circuit substituted for $Q_F$.

The second FET design problem is minimizing the associated capacitances shown in FIG. 17: the source-to-drain capacitance $C_{sd}$ and the gate-to-channel capacitance $C_{gc}$. $C_{sd}$ causes signal integration and $C_{gc}$ adds partially to $C_{sd}$ if the gate is connected to the output or is not AC grounded. If the gate is AC grounded, $C_{gc}$ causes the resistive channel of $Q_F$ to be an R-C delay line. The resultant delay-line phase shift can cause oscillation. The maximum $C_{sd}$, which may be determined by setting the response pole frequency equal to the bit rate, is $$C_{sd} \leq \tfrac{1}{2}\pi R_{sd} B.$$

For B=44.7 Mb/s, $R_F$=500 kΩ, the maximum $C_{sd}$ is 0.007 pF. This is achievable on a chip, but probably not in a package; thus $Q_F$ and the input transistor of amplifier 12 are preferably integrated. The allowable gate-to-channel capacitance (AC-grounded gate) for an extra feedback phase shift of 28 degrees is three times larger.

These two problems are addressed as follows in the design of $Q_F$. The ratio of source-drain conductance to gate voltage above threshold is reduced by: (1) increasing the channel length-to-width (aspect) ratio, where length is measured from source to drain; or (2) increasing the gate-oxide thickness for an MOSFET or increasing gate-junction width for a JFET, or MESFET, thereby also increasing the allowable gate area; or (3) adding impurities or defects in the channel to reduce the carrier mobility. The gate-channel capacitance $C_{gc}$ is decreased by: (1) decreasing the total gate area, or (2) increasing the gate-oxide thickness for an MOSFET or increasing the gate-junction width for a JFET or a MESFET. Illustratively the feedback FET fabricated by NMOS IC technology is 10 μm long by 1.5 μm wide and is designed for $R_{sd}$=500 kΩ.

The above combination of features is unusual in that, contrary to prior art FET applications, it yields a low-$g_m$, low-$f_T$, low-current FET. The resulting $Q_F$, a slow FET with typically $g_m < 10^{-6}$ S, is qualitatively different from normal FETs which have $g_m$ $10^{-2}$ S. As is well known in the art, $g_m$ is the transconductance of an FET.

The design procedure for $Q_F$ is first to estimate the noise of amplifier 12, then pick $R_{sd}$ for an allowable Johnson noise current. $R_{sd}$ determines the allowable gate-to-channel capacitance which then determines the maximum gate area for a given gate oxide thickness (MOS case) or gate depletion region thickness (JFET or MESFET cases). The length-to-width ratio is then determined by the required minimum gate voltage above threshold for the particular $R_{sd}$. If necessary, the gate oxide or gate depletion region thickness may be increased and the process iterated.

Figure 18:
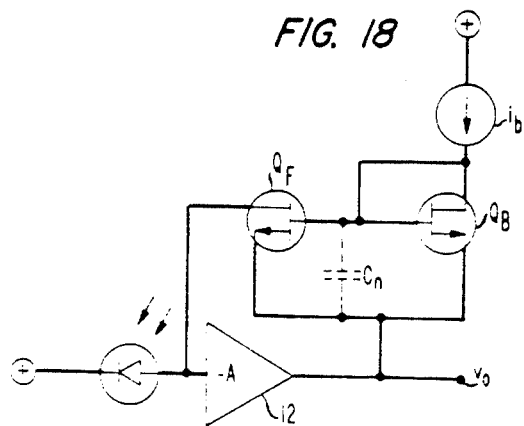
FIG. 18 shows a circuit which provides a tracking bias supply for $Q_F$.
Figure 19:
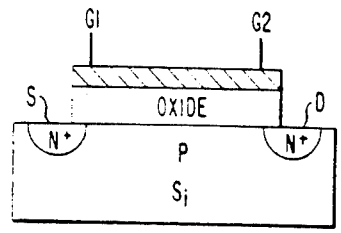
FIG. 19 shows a distributed-resistive-gate (DRG) enhancement mode NMOS FET for use as $Q_F$ in the receiver of FIG. 16.
Figure 20:
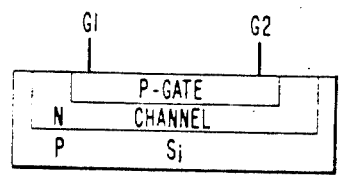
FIG. 20 shows a DRG-JFET for use as $Q_F$ in the receiver of FIG. 16.

One possible gate bias circuit for $Q_F$ is shown in FIG. 18. $Q_F$ and $Q_B$ are a matched pair (of a known size ratio), typically fabricated next to each other on the chip. The $Q_F$ gate voltage above threshold is set by the $Q_B$ drain current supply $i_b$. This scheme is similar to a well-known FET current mirror, except that $Q_F$ operates in the linear region of its current-voltage characteristic rather than in the saturation region. In fact, the $Q_F$ drain saturation photocurrent—above which $Q_F$ is a current source rather than a feedback resistor—is simply $i_b$ times the size ratio $Q_F/Q_b$. (The optional noise reduction capacitor $C_n$ serves as a bypass for noise in the $Q_B$-$i_b$ bias supply).

The reason FET $Q_F$ is a nonlinear resistor is that the local conductivity at any point along the channel is proportional to the local carrier number density, which in turn is proportional to the local gate-to-channel voltage above threshold, $\Delta V_{gc} = V_{gc} - V_T$. For a unipotential gate with a given $\{V_{gs}, \Delta V_{gc}$ decreases near the drain as $V_{sd}$ is increased—hence the conductivity is less near the drain and $R_{sd}$ of $Q_F$ is nonlinear.

Figure 21:
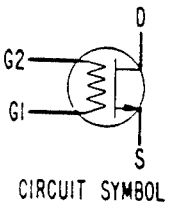
FIG. 21 is the circuit symbol for a DRG-FET as used herein.

As mentioned above, another solution is to make the gate oxide or gate depletion region thick enough and the aspect ratio large enough so that $\Delta V_{gs}$ for a given $R_{sd} = R_F$ is large compared to $V_{sd}$. A second, complementary approach shown in FIGS. 19-23, is to let $V_g$ vary along the channel length to maintain the gate-to-channel voltage $V_{gc}$ constant. In accordance with one feature of the latter embodiment of my invention, a variable $V_g$ is achieved by making the gate a resistive line and by applying different voltages to the source end (G1) and the drain end (G2). The circuit symbol for a resistive-gate FET is shown in FIG. 21. If the G1-to-source voltage above threshold $\Delta V_{g1} = V_{g1} - V_T$ is equal to the G2-to-drain voltage above threshold $\Delta V_{g2} = V_{g2} - V_d - V_T$, and if the resistivity of the gate is uniform along the channel length, then the channel resistivity is uniform and $\Delta V_{gc}$ is constant. $R_F$ of $Q_F$ is then essentially linear (except for the minor body effect). In addition, the constant gate-to-channel voltage means the AC gate-to-channel voltage is zero, thereby eliminating gate-to-channel capacitance current.

In the physical realizations of the distributed-resistive-gate FET, the NMOS resistive gate (FIG. 19) is polysilicon, but the JFET resistive gate (FIG. 20) is the gate diffusion itself. Other similar structures are possible.

Figure 22:
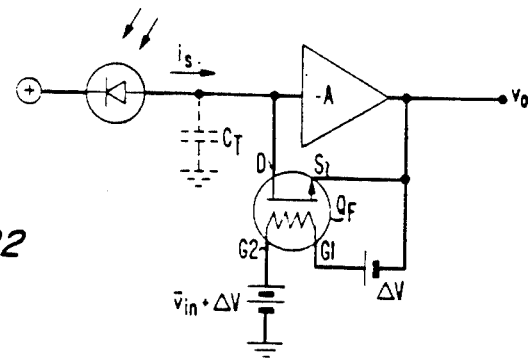
FIG. 22 shows the receiver of FIG. 16 incorporating a DRG-FET.

An illustrative embodiment of a receiver employing a resistive-gate FET is shown in FIG. 22. G1 of an enhancement-mode FET $Q_F$ is biased $\Delta V$ volts above the output $v_o$ to which the source is connected; G2 is biased $\Delta V$ volts above the average of the input voltage $v_{in}$. (For a depletion mode FET $Q_F$, G1 and G2 would be biased below $v_o$ and $v_{in}$, respectively.) G1 is biased by a floating voltage source between G1 and the source; the output of amplifier 12 which drives the source has a low impedance. The input of amplifier 12 has a high impedance and cannot be used to bias G2. However, the input voltage swing is 1/A times the output voltage swing and is therefore negligible. Thus, it is adequate to bias G2 by a voltage source matched to $v_{in}$.

Figure 23:
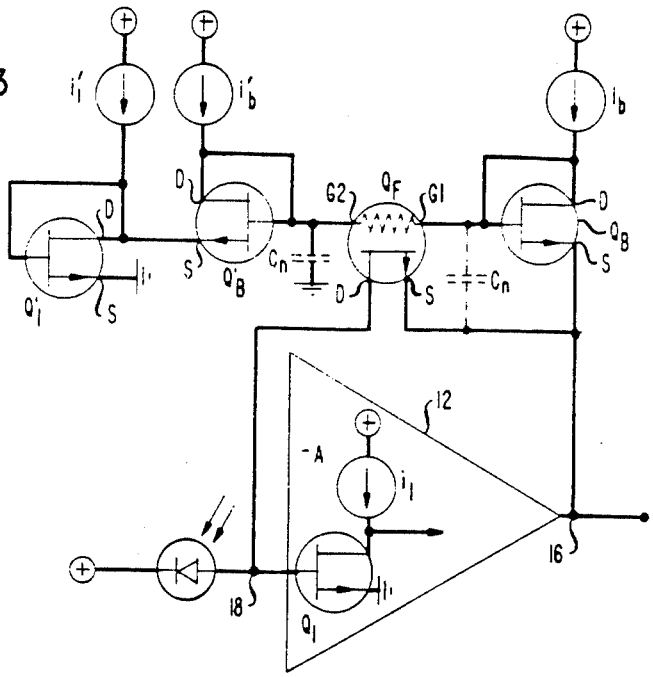
FIG. 23 shows the receiver of FIG. 16 incorporating a biasing scheme for a DRG-FET.

One biasing scheme for realization of FIG. 22 with enhancement-mode FETs is shown in FIG. 23. $Q_F$ has its source and drain connected respectively to the output and input terminals 16 and 18 of amplifier 12. The source end of the resistive gate of $Q_F$ is connected to the gate of FET $Q_B$ which has its gate connected to its drain and to a conventional current source $i_b$. The sources of $Q_B$ and $Q_F$ are connected to one another. In a similar fashion, the drain end of the resistive gate of $Q_F$ is connected to a virtually identical configuration of an FET $Q'_B$ and a conventional current source $i'_b$, except that the source of $Q'_B$ is instead connected to the drain of a third FET $Q'_1$. The latter has its gate also connected to its drain and to a conventional current source $i'_1$ and has its source grounded.

$Q'_1$ is matched to the amplifier input transistor $Q_1$ in the sense that their electrical characteristics scale. In addition, their current densities are essentially the same. Therefore, $V_D$ of $Q'_1$ is approximately equal to $V_{in}$. $Q'_B$ and $Q_B$ are essentially identical transistors, biased by the same current and matched to $Q_F$. Thus, $V_{g1-s}$ $V_{g2-d}$ and a linear $R_F$ is realized. (Optional noise decoupling capacitors $C_n$ are shown in phantom). By scaling the area of $Q'_1$ appropriately, the $i'_1$ supply may be eliminated.

Figure 25:
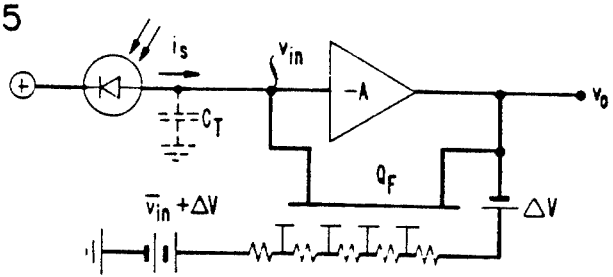
FIG. 25 shows a circuit in which four-gate FET is used as $Q_F$ in the receiver of FIG. 16.

One may also use a discrete version of $Q_F$ with multiple gates connected to a voltage divider. A 4-gate version is shown in FIG. 25. In the single gate analog, the gate would be biased at $\Delta V$ above the average of the source and drain voltages. This cancels, to first order, the $R_F$ nonlinearity and approximately cancels, to first order, the channel-to-gate capacitance effect.

Figure 24:
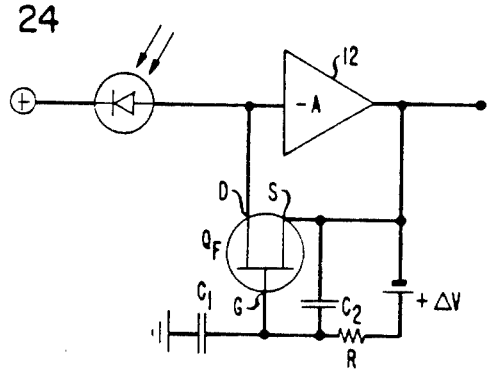
FIG. 24 shows a circuit in which the first order AC nonlinearity of $Q_F$ is cancelled in the receiver of FIG. 16.

A single gate feedback FET circuit using this effect is shown in FIG. 24. A capacitive voltage divider is formed on the gate of $Q_F$ by a capacitor $C_1$ connected between the gate and AC ground, a capacitor $C_2$ connected between the source and gate of $Q_F$, and the series combination of a resistor R and a voltage source $\Delta V$ connected in parallel with $C_2$. If $C_1=C_2$, then the capacitive voltage divider provides an AC signal bias of half the output signal voltage. This is an approximate average of the output signal voltage on the source of $Q_F$ and the negligible (on the order of 1/A) input signal voltage on the drain of $Q_F$. Thus, $R_F=R_{sd}$ of $Q_F$ is linearized for signal swings (above a low frequency cutoff). The resistor R provides DC bias to $Q_F$ from $v_o$. Thus, the DC resistance of $R_F=R_{sd}$ is not linearized. However, note, a fully linearized version using a resistive divider and a bias source like those in FIG. 23 is also practical. Both can be realized in IC form.

III(d). BJT/Saturated FET Feedback Receivers

Figure 26:
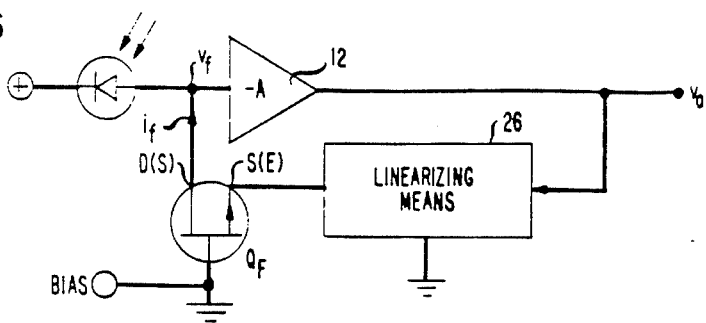
FIG. 26 shows an optical receiver in accordance with still another embodiment of my invention in which the current source of FIG. 9 is realized by a common gate or common base transistor $Q_F$ biased into saturation in combination with a linearizing circuit.
Figure 27:
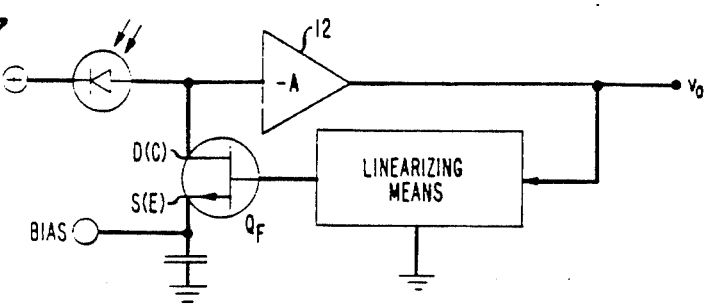
FIG. 27 shows a receiver similar to FIG. 26 but using a common source or common emitter transistor.

In this embodiment of my invention, the current source 14 of FIG. 9 is realized, as shown in FIGS. 26 and 27, by a saturated transistor $Q_F$ in combination with linearizing means 26 which compensate for the nonlinearity of $Q_F$ so that combination produces $i_f$ proportional to $v_o$.

In these circuits $Q_F$ comprises a BJT which operates in its constant-collector-current regime or a FET which operates in its constant-drain-current regime. The principal noise sources are the base and collector shot noise for the BJT, and the 4 kT$\Gamma g_m$ channel Johnson noise term for the FET, where $\Gamma$ is the channel noise factor and $g_m$ is the transconductive. Because the BJT noise term is relatively independent of transistor size, the BJT need only be scaled down to reduce its contribution to $C_T$. The FET noise term is proportional to $g_m$. Thus, a low $g_m$ feedback FET of the type described in section III(c) should be used.

The feedback transistor $Q_F$ may be connected common-gate/common-base (FIG. 26) or common-source/common-emitter (FIG. 27). In the common-gate/base configuration, the gate or base acts as an electrostatic shield, minimizing parasitic feedback coupling through the transistor ($C_{sd} << C_{gs}$ and $C_{gd}$; $C_{ec} << C_{be}$ and $C_{bc}$). Furthermore, any such coupling remaining is negative feedback. In the common emitter/source configuration, the capacitive coupling is directly via $C_{gd}$ or $C_{bc}$ and is positive feedback. Therefore, common-gate/base feedback configurations are preferred for stability reasons. Apart from parasitic capacitive feedthrough, the relevant stability and response considerations are those of the general circuit of FIG. 9 and were covered in section III(a).

The linearizing means 26, which drives the emitter or source of $Q_F$, is designed so that the transconductance of current source 14 of FIG. 9 is constant (independent of frequency within the signal bandwidth). For a BJT, a log converter is required to compensate the exponential emitter I-V characteristic [$v_e$ (kT/q) ln $v_o$+constant, typically]. For the low $g_m$, nonvelocity saturated FET discussed earlier, a square root converter is required ($v_s$ $v_o^{\frac{1}{2}}$).

Figure 28:
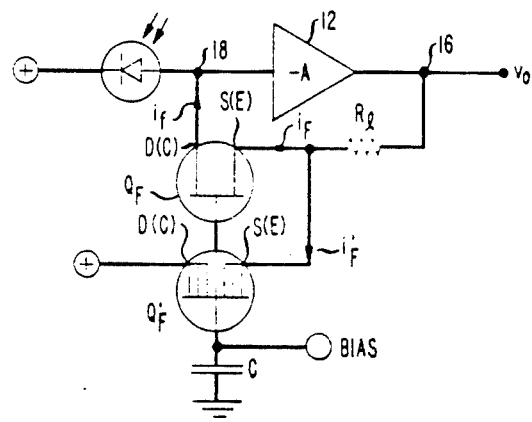
FIG. 28 shows an example of how the linearizing circuit of FIG. 26 or 27 can be realized by the combination of a resistor in series with $Q_F$ and a larger, matched transistor $Q'_F$ in parallel with $Q_F$.

The simplest embodiment of linearizing means 26 is a physically larger transistor $Q'_F$, matched to $Q_F$ and driven by $v_o$ through a resistor $R_1$ (FIG. 28).

The larger transistor $Q'_F$ has its input electrode (source/emitter) connected in parallel with the input electrode of $Q_F$ and has its bias electrode (gate/base) similarly in parallel with that of $Q_F$. The output electrode (drain/collector) of $Q_F$ is connected to the input terminal 18 whereas the input electrode of $Q_F$ is coupled through $R_1$ to the output terminal 16. A capacitor C couples the bias electrodes of $Q_F$ and $Q'_F$ to ground. Bias sources are connected to the output electrode (drain/collector) of $Q'_F$ and to its bias electrode (gate/base).

Figure 1:
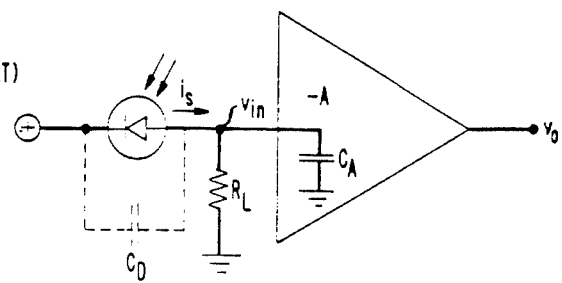
FIG. 1 shows a prior art optical receiver.
Figure 2:
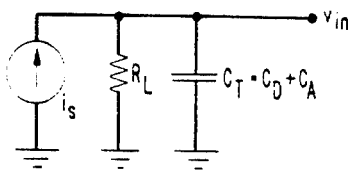
FIG. 2 is an equivalent circuit for FIG. 1.
Figure 3:
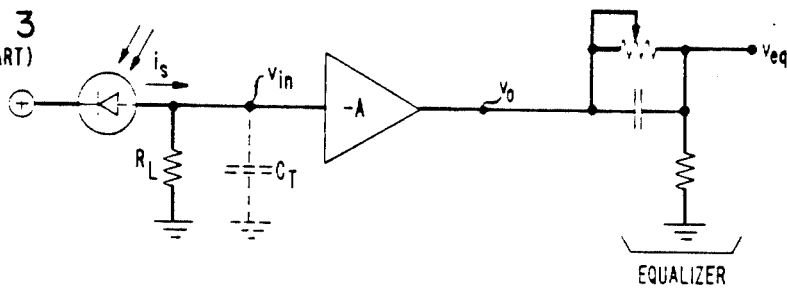
FIG. 3 shows the circuit of FIG. 1 with an equalizer at the output of the amplifier.
Figure 4:
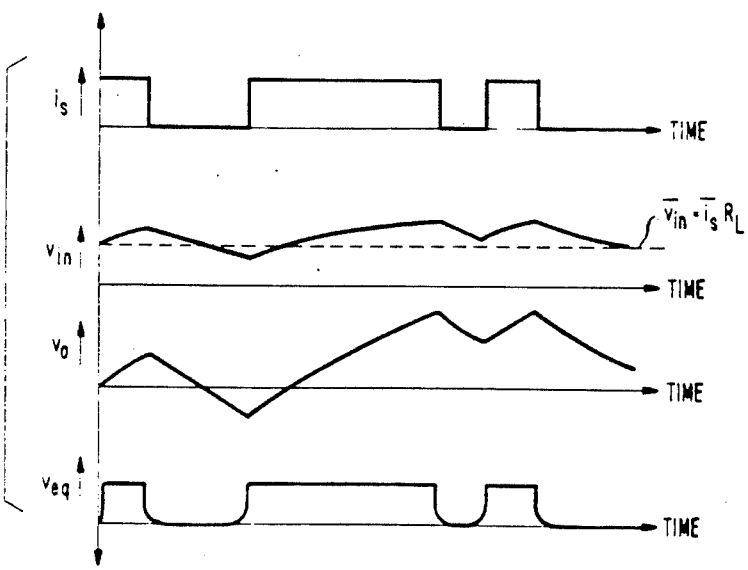
FIG. 4 shows various waveforms used in describing the operation of the circuit of FIG. 3.
Figure 5:
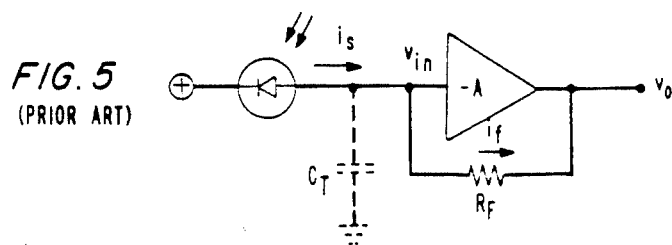
FIG. 5 shows another prior art optical receiver incorporating a transimpedance amplifier.
Figure 6:
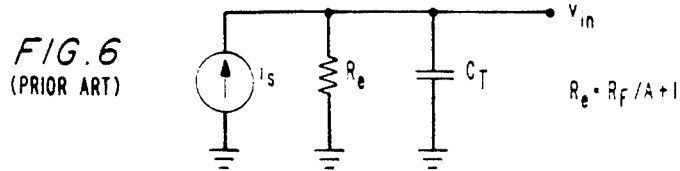
FIG. 6 is an equivalent circuit for FIG. 5.
Figure 7:
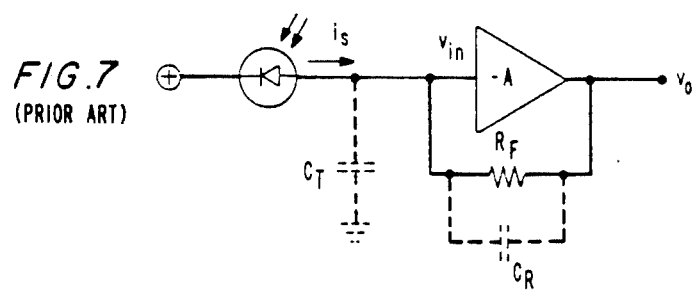
FIG. 7 shows the circuit of FIG. 5 including parasitic capacitances.
Figure 8:
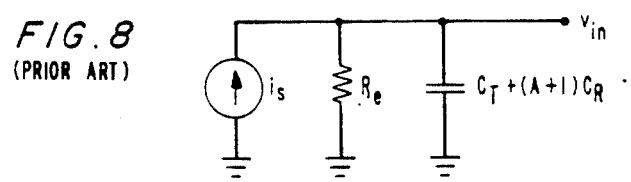
FIG. 8 is an equivalent circuit for FIG. 7.

The fact that $Q'_F$ is larger than $Q_F$ in FIG. 28 is indicated by the multiple vertical lines for the source/emitter and drain/collector designations. The linear voltage drop across $R_1$ is much larger than the nonlinear AC voltage on the source/emitter of $Q_F$ so that ($i_F+i'_F$) is proportional to $v_o$. The current division ratio $\alpha=i_F/(i_F+i'_F)$ between the two sources or emitters is constant in current because both follow the same current-to-voltage law. Thus, $i_f$ is proportional to $v_o$ as required. An alternative circuit employs a single transistor having a dual drain/collector (of the type depicted in FIG. 3C); operation is analogous to that described above.

Figure 29:
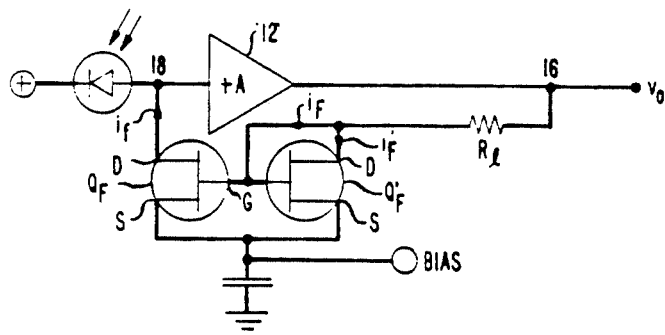
FIG. 29 shows an example of how the linearizing circuit of FIG. 26 or 27 can be realized by a current-mirror FET scheme.

The common source analog of FIG. 28 utilizes a current-mirror configuration as shown in FIG. 29.

Here, the forward gain of amplifier 12 is positive, instead of negative, because the feedback voltage gain is negative rather than positive. The larger matched $Q'_F$ has its input electrode (drain) coupled through $R_1$ to the output terminal 16. The output electrode (gate) of $Q'_F$ is connected to the input electrode of both $Q_F$ (gate) and $Q'_F$ (drain), and the bias electrodes (sources) of $Q_F$ and $Q'_F$ are connected to one another. Finally, the output electrode (drain) of $Q_F$ is connected to the input terminal 18. As before, $i_f$ is proportional to $v_o$.

One advantage of this current division technique is that the impedance at the emitter or source of $Q_F$ is lowered moving the associated $R_eC_{se}$ pole above the passband, insuring both flat frequency response and stability. (Again, note that the unity loop gain frequency $f_u$ is ideally just above the passband). As $R_1$ is also reduced by a factor $\alpha$, its parasitic shunt capacitances are no longer a problem. (Both the signal current and noise power of $R_1$ divide between the two drains/collectors; at the small feedback collector, $R_1$ is effectively multiplied by the current division ratio $\alpha$).

Another class of linearizing circuits (FIG. 30) provides the appropriate emitter/source drive by sensing the current through the large collector/drain of a dual collector/drain $Q_F$ (or through a large area transistor $Q_F'$ in parallel with $Q_F$ as in FIG. 28) to servo the source/emitter voltage. Here, a dual drain/collector $Q_F$ and a second amplifier 28 having a gain $\beta_2$ are connected in series in the feedback loop. $Q_F$ has its output electrode (smaller drain/collector 1) connected to the input terminal 18 and its input electrode (source/emitter) connected to the output of amplifier 28. The bias electrode (gate/base) of $Q_F$ is connected to a bias voltage source and may be coupled through a capacitor C to AC ground. Amplifier 28 has a pair of inputs, one of which (noninverting) is coupled to the input terminal 16 and the other of which (inverting) is connected to a current sensing resistor R which is connected between the second output (larger drain/collector 2) of $Q_F$ and ground.

Even though positive and negative inputs are shown on amplifier 28, it need not be an operational amplifier. Depending on the gain required, a single transistor stage (with, say, the positive input being the source/emitter and the negative input being the gate/base) could be adequate.

In operation, if $\beta_2$ is large enough, then the voltages $V_\beta$ at the inputs of amplifier 28 are nearly equal. But, the voltage across the sensing resistor is $I_{d2}R \ V_\beta$. Therefore, $I_{d2}$ is proportional to $v_o$ and $I_{d1} = i_f$ is proportional to $v_o$ because the current division between the drains/collectors is constant.

Note, again that the major loop unity gain frequency need only be just above the passband. Therefore, the $Q_F$-$\beta_2$ closed loop poles need only be somewhat above the passband for stability.

In a similar fashion, for a forward amplifier 12 having positive gain, shown in FIG. 31, the gate/base is used as the input electrode and is connected to the output of amplifier 28, whereas the source/emitter is used as the bias electrode and is connected to the bias voltage source.

Both linearizing approaches require extra loop gain: in FIGS. 28 and 29 for the extra (large) signal drop across $R_1$; and in FIGS. 30 and 31 for the minor loop gain. In FIGS. 30 and 31, because the extra gain is in a minor loop, the output swing required is reduced, and a minor loop pole (of higher frequency) is added to the overall loop gain.

An alternative approach is to linearize $Q_F$ itself and, thereby, dispense with the need for linearizing means 26. As shown in FIG. 32, one way is to pre-bias the FET feedback transistor with a conventional current source, $i_b$, connected to the input terminal 18 of forward amplifier 12. $Q_F$ is linearized because the feedback current swing, $i_f = i_s$ (the photocurrent), is much less than $i_b$. For a typical 44.7 Mb/s application, the maximum photocurrent is about 0.2 $\mu$A (due to a dynamic range extender circuit described later in section IV). The prebias $i_b$ is then typically a few $\mu$A. IF $Q_F$ or the current source $i_b$ were BJTs, one would have shot noise of a few $\mu$A. Thus, $Q_F$ and the current source $i_b$ preferably comprise FETs. As is well known for circuits with an n-channel $Q_F$, $i_b$ can be typically a p-channel drain or a depletion mode n-channel with the gate shunted to the source. Again, both pre-bias and $Q_F$ transistors would be low-$g_m$ FETs as described in section III(c). However, for FETs the preferred approach, as described in section III(c), is to not operate in the saturated drain current region. Rather, the FET is used as a feedback resistor.

A second way to linearize $Q_F$ is to make it a short channel device and operate it in its velocity saturated region so that $g_m$ is constant. The problem is in obtaining a low enough $g_m$ to avoid excess $4\ kT\Gamma g_m$ current noise. The transconductance per micron of gate width in Si is about $10^{-1}$ S. Thus, a transistor with a 1 $\mu$m wide channel would have the Johnson noise of a 10 k$\Omega$ resistor and would give rise to a major noise penalty even at 500 Mb/s. Furthermore, the minimum signal currents might not bring $Q_F$ out of the sub-threshold region so that $g_m$ would then not be constant. (Currents of 1 $\mu$A for a 1 $\mu$m × 1 $\mu$m FET may be required). This problem is solved by adding a pre-bias current source as described with reference to FIG. 32. However, the noise penalty will be more tolerable for finer line lithography and higher bit rates. Then, operation without a pre-bias current source may be acceptable.

Finally, another option is simply not to linearize $Q_F$ at all; that is, to drive the feedback BJT or FET directly from the amplifier output. The resultant nonlinear current-to-voltage response may be satisfactory for short transmission links (e.g., optical data links), but it is not satisfactory for long haul transmission links (due to pattern dependent timing jitter problems) or for video links. Furthermore, the current source transconductance $g_f$ goes to zero for zero feedback current ($g_f \sim I_e$ for BJTs, $g_f \sim I_s^{\frac{1}{2}}$ for long channel FETs). Therefore, the transition from logic 1 (pulse) to logic 0 (no pulse) has an odd slow decay "integrating" tail. In addition, at high input optical signal levels, $g_f$ increases, requiring a wider bandwidth gain A for stability. In optical receivers, for a 20 dB (optical) dynamic range (100:1 in photocurrent), the resultant bandwidth increase is about 100:1 for a BJT $Q_F$ ($g_f \sim I_F$), and about 10:1 for a FET $Q_F$ ($g_f \sim I_F^{\frac{1}{2}}$). Thus, the nonlinearized option is not presently preferred.

IV. Wide Dynamic Range, High Sensitivity Receivers
IV(a). General

The nonintegrating receivers of my invention have high sensitivity and wide dynamic range when compared to the prior art integrating receivers. As discussed in section III, the fact that the NIR does not integrate the input signal means that the forward amplifier does not saturate on long strings of pulses. However, if the average intensity of the input signal is too high, the amplifier may still saturate. Accordingly, another aspect of my invention is to further extend the dynamic range of my NIRs by adding an input AGC circuit capable of diverting excess input current away from the amplifier. As before, the input current is illustratively generalized by a photodiode 20 connected to input terminal 18.

Figure 40:
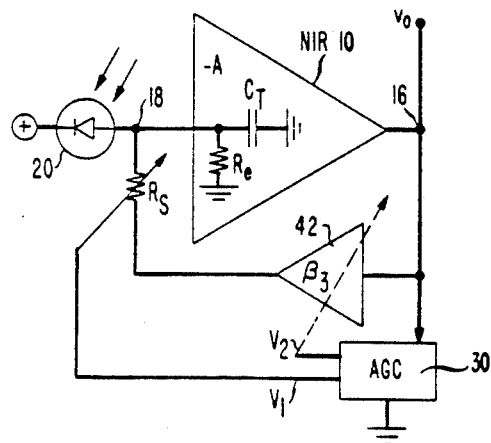
FIG. 40 shows the optical receiver of FIG. 9 in a transimpedance arrangement formed by a variable resistor $R_s$ and a feedback element $\beta_3$ in combination with a range extender, in accordance with still another embodiment of my invention.

As shown in FIGS. 33 and 40, NIR 10 is connected between output and input terminals 16 and 18. It is important to note that in these figures the triangular symbol for an amplifier is used to designate the entire NIR 10 of FIG. 9 and not just the forward amplifier 12 of FIG. 9. However, the voltage gain A of NIR 10 and forward amplifier 12 are the same. Accordingly, the equivalent input resistance $R_e$ and the total input capacitance $C_T$ of the NIR (FIG. 10) and the gain A are shown within the triangular symbol. The remainder of the circuit includes a variable resistance device $R_s$ and an AGC circuit 30. The variable resistance device $R_s$ has one end connected to the input terminal 18 and the other end either AC grounded (FIG. 33) or coupled through a feedback amplifier (of gain $\beta_3$ typically less than 1) to the output terminal 16 (FIG. 40). The AGC circuit 30 has its input coupled to the output terminal 16. It also has at least one output responsive to $v_o$ for varying the resistance of $R_s$. It is apparent, therefore, that these wide-dynamic-range receivers use the variable resistance device $R_s$ either as an input shunt (FIG. 33) or as a transimpedance feedback element (FIG. 40) for the NIR 10. Since the signal bandwidth input impedance of my NIR is resistive, adding an external shunt resistance does not change the frequency response. In contrast, adding such an AGC circuit to a prior art integrating amplifier would change the input pole frequency and would therefore require tracking equalization. The transimpedance AGC (FIG. 40) does not change the frequency response either if its feeback gain $\beta_3$ is flat in the passband. When active, these AGC circuits 30 add noise, principally the Johnson noise of the variable resistance device $R_s$. Thus, for good sensitivity, the AGC circuit should usually be off at the lowest input currents ($R_s$ ideally infinite); the sensitivity is then that of NIR 10 alone. AGC is provided above an AGC threshold as depicted in the illustrative AGC function of FIG. 34; if the input current is large enough so that a high front-end impedance is no longer required (for sensitivity), $R_s$ can be turned on without imposing an unacceptable error rate. The output range below the AGC threshold is typically less than about 100:1 and can be handled by a conventional AGC post-amplifier (not shown).

Figure 35:
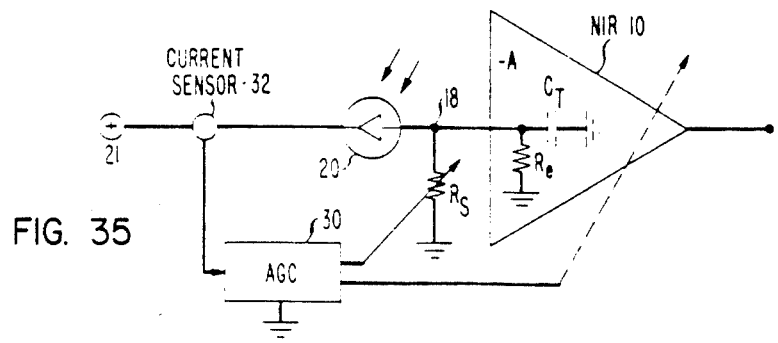
FIG. 35 is similar to FIG. 33 except that the AGC circuit is responsive to the photocurrent $i_s$ rather than the output voltage $v_o$.

The variable resistance devices $R_s$ described hereinafter will be FETs. However, other variable resistance elements can be used; for example, a photoconductor controlled by a light source or a forward biased diode (including the photodiode 20). Similarly, the AGC circuit 30 may be responsive to the current $i_s$ signal either indirectly—by being connected to the output of NIR 10 (e.g., FIG. 33 or 40)—or directly—by measuring the DC photocurrent on the bias side of the photodiode (e.g., FIG. 35). In the latter case, a current sensor 32 is located between the reverse bias source 21 and the photodiode 20 and has its output coupled to the input of AGC circuit 30. The latter embodiment of my invention is preferred for use with discrete AGC circuits where the changes are discontinuous. In such embodiments the AGC circuit would simply be a switch or threshold detector for reducing $R_s$ from one discrete value $R_{s2}$ to another discrete value $R_{s1} << R_{s2}$ when the signal current increases above a predetermined threshold.

IV(b). Input Shunt AGC Wide Dynamic Range Receivers

The input shunt, wide dynamic range receiver AGC is provided by a variable input shunt resistance $R_s$ controlled by an AGC circuit (FIG. 33). If the resistance of the parallel combination of $R_s$ and the equivalent resistance $R_e$ of NIR 10 is servoed to be inversely proportional to the photocurrent signal level, the output level is maintained constant.

Although input shunt receivers of this type provide AGC at low photocurrents, they do so with some loss of sensitivity. The reason for the reduced sensitivity is that $R_s$ must be comparable to or less than $R_e$ to affect the photocurrent-to-voltage gain; and $R_s$, a real resistance, has Johnson noise, although $R_e$, a virtual resistance, does not. Thus, the preferred AGC circuit for FIG. 33 turns $R_s$ off at low photocurrents, then starts servoing only when the output signal indicates a large enough photocurrent so that the Johnson noise of $R_s \sim R_e$ doesn't degrade the signal-to-noise ratio. The resultant AGC function is shown in FIG. 34. The AGC circuit has a current threshold below which its output voltage increases with increasing current and above which its output voltage is constant. $R_s$ has a high resistance $R_{s2}$ (ideally infinite) below the threshold and a low, variable resistance $R_{s1} < R_e << R_{s2}$ above the threshold.

Note that the ratio of the photocurrent signal $i_s$ to shunt Johnson noise current $i_n$ improves above the AGC threshold; $i_s R_s^{-1}$ for constant amplifier output and $i_n R_s^{-\frac{1}{2}}$, therefore $i_s/i_n$ $i_s^{+\frac{1}{2}}$.

Figure 36:
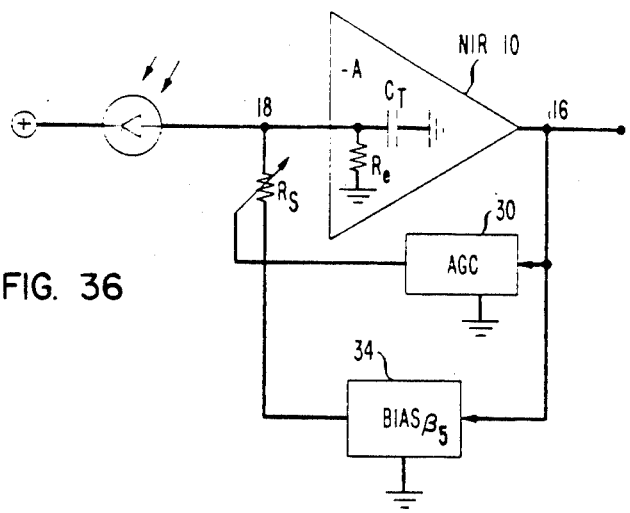
FIG. 36 is an embodiment of FIG. 33 in combination with a slow, non-inverting, feedback integrator which provides bias on the shunt $R_s$ to avoid saturating the forward amplifier.
Figure 37:
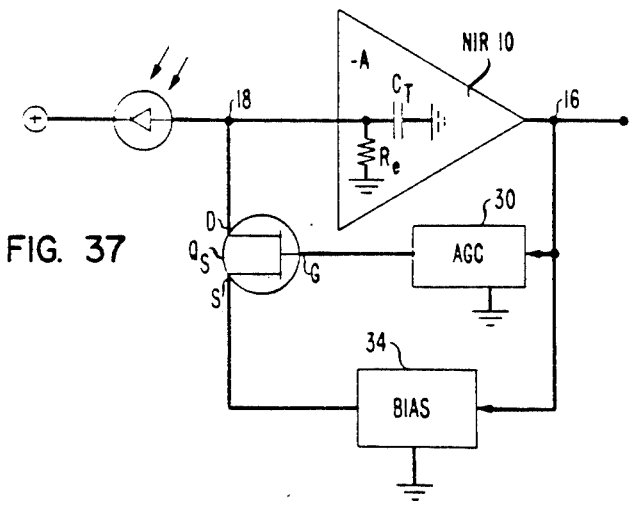
FIG. 37 is identical to FIG. 36 except that $R_s$ is shown explicitly as a FET ($Q_s$)

As single ended gain elements are presently preferred in the forward amplifier 12 of NIR 10 (for noise and stability reasons), a shunt element bias should be provided as shown in FIGS. 36 and 37; i.e., a slow, noninverting feedback integrator 34 has its input coupled to the output terminal 16 and its output coupled to the other end of $R_s$. Note, however, that $R_s$ is still AC grounded through integrator 34. We are concerned here with the DC bias supplied to $R_s$; e.g., as in FIG. 37, the bias supplied to the source of an FET $Q_s$ used as the $R_s$ device. In the latter case, the gate of $Q_s$ is connected to the output of AGC circuit 30, and the drain of $Q_s$ is connected to the input terminal 18.

The integrator 34 is slow in the sense that it transmits to $R_s$ primarily the average of $v_o$ and not its AC changes. To this end the gain $A\beta_5$ of the feedback loop formed by NIR 10 and integrator 34 should be much less than unity at the lowest frequency component of interest in the input signal. For example, if the input signal is a 44.7 Mb/s digital signal, the lowest frequency component to be preserved might be 600 Hz. Then the unity gain frequency could be 50 Hz.

Alternatively, a differential input stage could be used in amplifier 12 but will add some noise. A fixed bias may require the amplifier gain to be restricted to avoid saturating on thermal drifts unless matching to the input transistor comparable to that obtained in a differential pair is achieved.

Note that the input shunt AGC amplifier is particularly stable. The input shunt $R_s$ actually decreases the voltage feedback ratio $v_f/v_o$ due to the feedback current source 14 of NIR 10 of FIG. 9, where $v_f$ is the voltage at input terminal 18 due to feedback only. Therefore, shunt AGC amplifiers are preferred for very high bit rate applications. The out-of-band forward amplifier rolloff need not be single pole; a video amplifier is sufficient as discussed in section III(a). This configuration allows the gain to be maximized, thus minimizing following stage noise.

Unfortunately, only a small input voltage swing [$v_o$(max)/A] is available to drive the photocurrent through the input shunt [about 10 mV for A=100, $v_o$(max)=1 V.] Consequently, the shunt device conductance (1/$R_s$) required to achieve a given dynamic range is increased. The increased front-end capacitance due to these physically large devices (typically FETs) results in a sensitivity penalty and thus a dynamic range versus sensitivity trade off. Nevertheless, I expect that a dynamic range of about 40 dB (optical) with sensitivities of better than $-50$ dBm in 1.3 $\mu$m, 45 Mb/s systems is achievable using this circuit.

Figure 38:
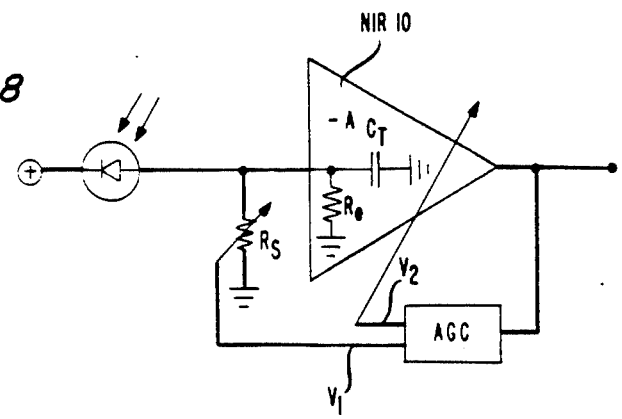
FIG. 38 is an embodiment of FIG. 33 in which the AGC circuit controls both $R_s$ and the gain of the receiver of FIG. 9.

To increase the dynamic range further without sacrificing sensitivity, the voltage swing across the variable resistance device $R_s$ should be increased. Then, more photocurrent can be driven through a physically smaller device, increasing the dynamic range while avoiding the front-end capacitance sensitivity penalty. For input shunt receivers, the voltage gain A of NIR 10 may be decreased at high photocurrents to increase the allowable input signal voltage which appears across the shunt device. As shown in FIG. 38, the AGC circuit 30 has a second output $V_2$ which is used to vary the gain A of NIR 10 above a second input current threshold. AGC output $V_1$ varies $V_s$ The preferred variable gain, variable input shunt AGC technique is also the simplest; to run the receiver as an input shunt receiver until $R_s$ is near its minimum, then to decrease the gain A to further extend the dynamic range. Again, at low photocurrents $R_s$ is off and the voltage gain A is as large as possible to minimize the noise contributions of following stages. When the photocurrent reaches the AGC threshold, $R_s$ is turned on; above the threshold $R_s$ is servoed to control the output signal level. Once $R_s$ is less than $R_e$, the equivalent resistance of NIR 10, the feedback represented by Re is no longer required to keep the input current-to-voltage pole $C_T R_s R_e/(R_s+R_e)$ above the passband. Thus, the receiver gain A may be decreased. If $R_s$ is a FET, the linear range of drain voltage ($v_d$) versus drain current ($i_d$) increases at lower resistances. This characteristic also favors reducing the gain A, which increases the voltage swing across the shunt FET only as $R_s$ approaches its minimum.

For a FET input gain element in the forward amplifier 12 of NIR 10, achieving the gain reduction in the first stage avoids large drain current swings which could saturate the following stage (1 volt into a 50 mS transistor gives 50 mA). Additionally, since most gain elements of this type use a low input impedance current amplifier second stage, changing the input FET gain does not change the amplifier 12 pole frequencies.

One technique is to use a standard dual gate FET for the input stage; the input signal is coupled to the first gate and the second output of the circuit is coupled to the second gate. Equivalently, one may reduce the drain bias voltage and drain current of a regular FET to cause operation in the linear $v_d$-$i_d$ region. (The dual gate FET is equivalent to two cascoded conventional FETs). Both the available gain range and the maximum linear input voltage range are excellent, especially for enhancement MOSFETs. The linear region conductance of an enhancement mode MOSFET is essentially proportional to the gate voltage because the charge carriers are all in a very thin surface inversion layer.

Figure 39:
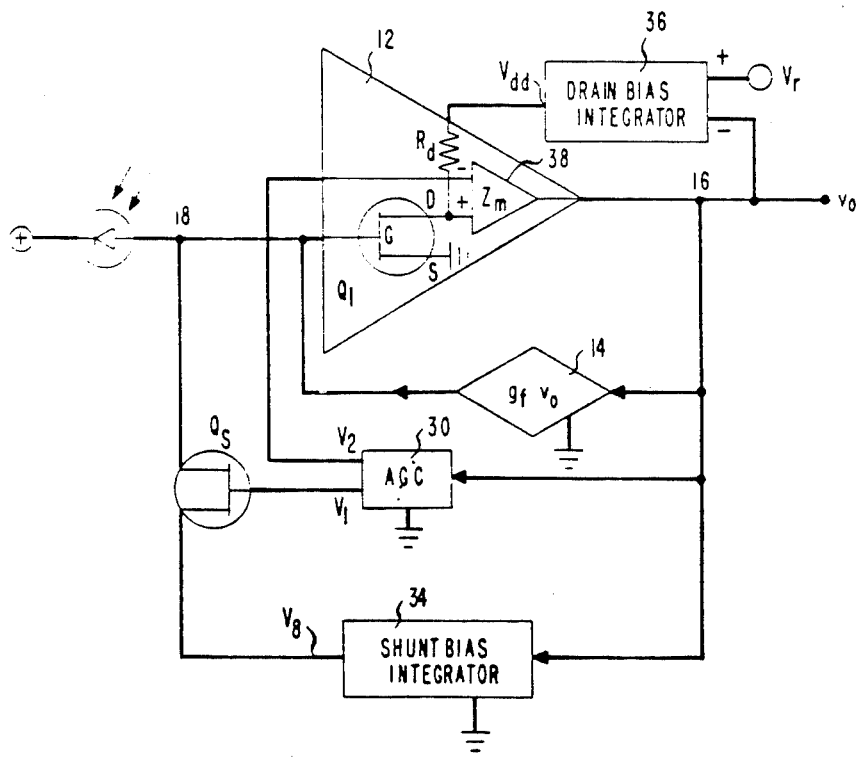
FIG. 39 is an embodiment of FIG. 38 with the front end FET ($Q_1$) of the receiver of FIG. 9 shown explicitly in combination with a drain bias integrator for $Q_1$ and a shunt bias integrator for $Q_s$ ($R_s$)

An illustrative variable gain, variable input shunt receiver is shown in FIG. 39. This receiver uses a FET $Q_s$ as the variable resistance shunt device $R_s$ and uses a single gate FET $Q_1$ as the input stage of forward amplifier 12. More specifically, the forward amplifier 12 and the feedback current source 14 of NIR 10 are shown explicitly. In addition, the input stage FET $Q_1$ is shown having its gate connected to input terminal 18, its source connected to AC ground and its drain connected both to the positive input of transimpedance amplifier 38, which is part of forward amplifier 12, and through drain resistor $R_d$ to the output of drain bias integrator 36. The positive input to integrator 36 is supplied by a reference voltage source $V_r$, and the negative input is supplied by the output voltage $v_o$. The negative (bias) input to amplifier 38 is supplied by the second output $V_2$ of AGC circuit 30.

The AGC operation is realized as follows. For photocurrents below the AGC threshold, $V_1$ of AGC circuit 30 is negative, turning $Q_s$ off, and $V_2$ of AGC circuit 30 is set for a high gain $Q_1$ drain voltage. The average output voltage $v_o$, which is determined by the feedback path through current source 14, is less than $V_r$, therefore the drain bias integrator 36 is at its positive limit. Under these conditions, maximum drain current is provided to $Q_1$ for high gain and maximum sensitivity.

For photocurrents above the AGC threshold, $V_1$ goes positive, turning $Q_s$ on. The resistance $R_s$ of $Q_s$ is servoed to provide AGC. When $V_1$ is at its positive limit (set by the $Q_s$ selected), $R_s$ is at its minimum.

At this point, $V_2$, which controls the drain voltage $V_{d1}$ of $Q_1$ is reduced in order to reduce the gain A. $I_{d1}$ is reduced indirectly via the drain bias integrator 36. As $V_2$ is reduced, $v_o$ increases causing the input shunt bias integrator 34 to reach its positive limit; the gate bias of $Q_1$ is now at its positive limit for maximum linear input voltage range at reduced gains. As $V_2$ is reduced slightly further, $v_o$ increases to $V_r$, the drain bias integrator 36 comes out of positive saturation and starts servoing the voltage $V_{dd}$ on $R_d$; hence $I_{d1}$ is servoed also. This technique requires no tracking components and works to very low gains. Because the DC output voltage changes, AC output coupling to post-amplifier stages (not shown) would be preferred.

A HIC version of this circuit has been tested at 45 Mb/s, using the capacitive-resistive low current feedback circuit of FIG. 15 described in section III(b), GaAs FETs for $Q_s$ and $Q_1$, and a BJT transimpedance amplifier 38. A dynamic range (simulated) of 52 dB (optical) was obtained, along with a $-50$ dBm sensitivity. An NMOS IC version using the resistive FET low current feedback described in section III(c) has also been designed.

IV(c). Transimpedance AGC Circuits

As mentioned in section IV(a), the variable resistance device $R_s$ may also be connected as a transimpedance feedback element. Thus, in FIG. 40 $R_s$ has one end connected to input terminal 18 and its other end connected to the output of a feedback element 42 which in turn derives its input from $v_o$. Element 42 has a feedback gain $\beta_3$ which is typically less than 1. As before, one output $V_1$ of AGC circuit 30 controls the resistance of variable resistance element $R_s$ in response to $v_o$. Optionally, AGC circuit 30 may also have a second output $V_2$ for controlling $\beta_3$. In the receiver of FIG. 40, the excess photocurrent above the AGC threshold is absorbed by the feedback element $R_s$. The transimpedance feedback produces an equivalent input shunt resistance $R_{se}$ which is equal to $R_s$ divided by the loop gain plus unity; $R_{se} = R_s/(A\beta_3 + 1)$. $R_{se}$ and $R_e$ divide the photocurrent. Both $R_s$ and $\beta_3$ may be varied by the AGC circuit 30 to control $R_{se}$ and, thus, the current-to-voltage gain. In this way, the maximum conductance of a given variable resistance device may be multiplied by the maximum stable loop gain plus unity. The maximum input photocurrent is increased over that of the original fixed gain shunt circuit of FIG. 33 by the same factor, $(A\beta_3 + 1)$.

As mentioned previously, the AGC circuit may simply be a switch or threshold detector for reducing $R_s$ from one discrete value $R_{s2}$ to another discrete value $R_{s1} << R_{s2}$ when the signal current increases above a predetermined threshold. This embodiment is particularly useful in low optical power lightwave systems such as those employing light-emitting diodes as sources.

One of the dominant concerns in the design of these transimpedance receivers is stability. The resultant tradeoffs usually involve reduced bandwidth compared to the intrinsically stable shunt AGC receivers described in Section IV(b). (Transimpedance AGC increases the loop voltage again, whereas shunt AGC decreases the loop voltage gain.) However, the transimpedance receiver has less auxiliary low frequency circuitry than the variable gain shunt. In addition, some designs preserve the DC signal information better. Thus, the transimpedance versions may be preferred for lower bit rate economy designs, such as data links, and for video links (especially if an economical high bandwidth technology, such as NMOS, is used for these low bandwidth applications).

The first of two stability considerations is that the gain product $A\beta_3$ be effectively single pole up to its unity gain frequency. As the gain pole should be above the signal bandwidth, the minimum unity gain frequency is $A\beta_3$ times the signal bandwidth. Thus, if transimpedance feedback is used to improve the maximum photocurrent by a factor $A\beta_3 + 1$, the forward amplifier rolloff should be controlled (i.e., made to be effectively single pole) up to a unity gain frequency greater than the bandwidth by approximately the same factor $(A\beta_3)$. For example, a 10:1 photocurrent increase requires the rolloff to be controlled up to approximately 9 times the bandwidth.

The controlled rolloff forward amplifier typically has less bandwidth than the video forward amplifier usable in shunt AGC receivers. This bandwidth reduction is minimized by decreasing the high current transimpedance loop gain $A\beta_3$. Therefore $A\beta_3$ is often much less than the gain A required for the low current feedback circuit because $\beta_3$ is less than unity.

Since the high current feedback path amplifier gain $\beta_3$ is typically less than one, its bandwidth can exceed the gain-bandwidth product of the technology. Furthermore, a feed-forward capacitor (of the type shown in FIG. 44) can be used. Thus, poles in $\beta_3$ are no problem. In fact, the feed-forward capacitor can add a zero to $\beta_3$ to cancel an extra pole in A (e.g., if A is multi-stage).

Figure 41:
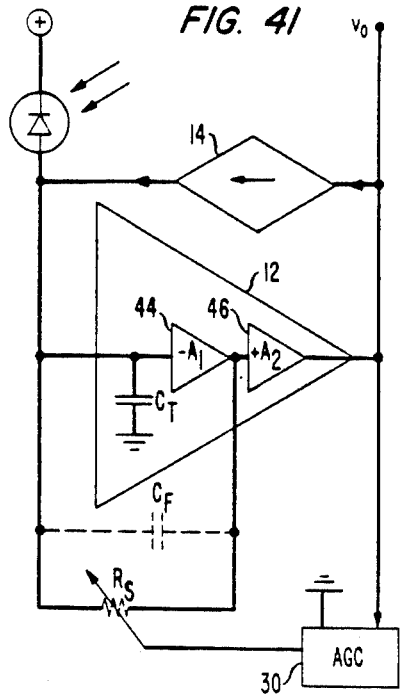
FIG. 41 shows the optical receiver of FIG. 9 as having two stages in the forward amplifier with intermediate stage feedback used instead of the feedback element of FIG. 40.

Another approach to handling this aspect of stability is applicable when the forward amplifier 12 has multiple stages. Two stages 44 and 46 arranged in tandem are illustrated in FIG. 41. The first stage has gain $-A_1$ and a variable feedback resistance device $R_s$ connected between its input and output, and the second stage has a gain $+A_2$. The resistance $R_s$ is under the control of AGC circuit 30.

Both approaches preserve DC photocurrent information, given proper tracking of the DC parameters of $\beta_3$ in FIG. 40, or of $A_2$ in FIG. 41. Thus, these are alternatives to a shunt amplifier with a differential input stage or a tracking bias source.

Figure 42:
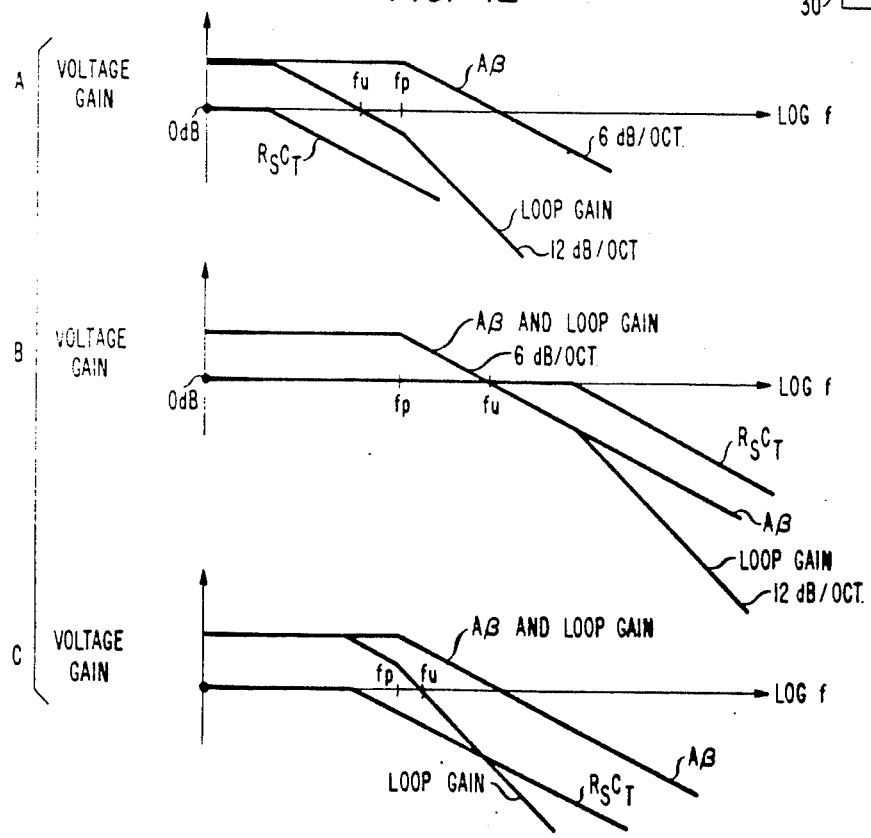
FIG. 42, Parts A–C, are frequency response plots for explaining the operation of the circuit of FIG. 41.

The second stability consideration alluded to earlier concerns the two poles in the high current transimpedance feedback loop; in FIG. 40 these are the dominant fixed frequency gain pole in $A\beta_3$ and the $R_sC_T$ feedback pole which moves as $R_s$ is varied to provide AGC. $R_s$ is large during turn-on at the AGC threshold; the $R_sC_T$ feedback pole frequency is then much less than the gain pole frequency; the feedback pole is dominant and the loop is stable (FIG. 42A). The loop is also stable when $R_s$ is small enough so that the $R_sC_T$ pole frequency is greater than the $A\beta_3$ unity gain frequency (FIG. 42B). However, for intermediate values of $R_s$, for which the feedback and gain poles both contribute to the loop gain rolloff above unity loop gain, the loop phase shift approaches 180 degrees (FIG. 42C). The receiver response is then either peaked or unstable. This problem may be avoided by use of discrete AGC circuits where $R_s$ is either infinity, or low enough so the $R_sC_T$ pole is above the unity loop gain frequency.

The low current feedback brings the unity loop gain frequency to the upper band edge as described in section III(a). If the forward amplifier pole frequency is not much higher than the upper band edge, which is typical, the receiver becomes marginally stable for $A\beta_3R_sR_e$. Thus, the region of marginal stability extends from when the transimpedance AGC effectively starts $(A\beta_3R_s \sim R_e)$ until $R_s$ is small enough so the $R_sC_T$ pole is above the $A\beta_3$ unity gain frequency.

Similar analysis applies to the receiver of FIG. 41 where, in using FIGS. 42A–C, $A_1$ is substituted for $A\beta_3$.

There are several ways to solve this instability problem:

(1) Reduce the loop gain for values of $R_s$ which cause the loop phase shift at any frequency $f_o$ to be near 360 degrees (FIGS. 43–46). Reducing the gain decreases $f_u$ below $f_o$ thereby preventing oscillation.

Figure 47:
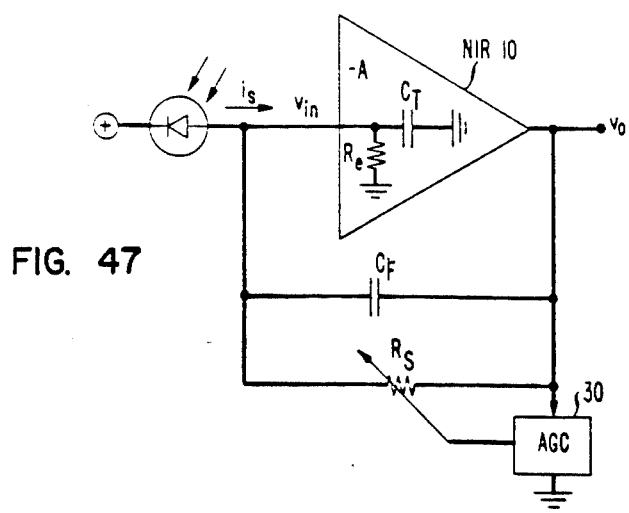
FIG. 47 is an embodiment of FIG. 40 with $\beta_3 = 1$ and in which stability is achieved by reducing the transimpedance feedback phase shift below 90 degrees above the signal bandwidth by means of a fixed capacitor $C_F$ in parallel with $R_s$.
Figure 48:
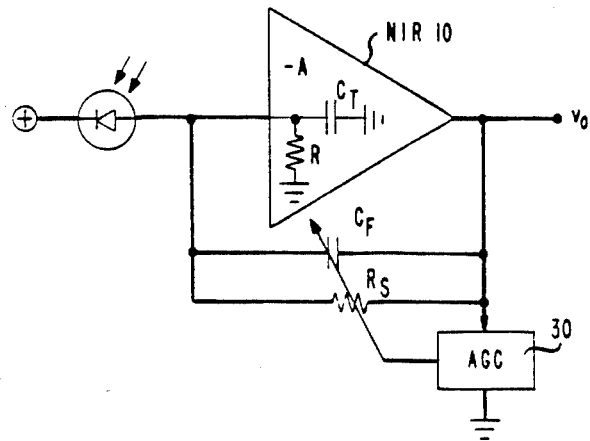
FIG. 48 is similar to FIG. 47 except that $C_F$ is variable and under AGC control.
Figure 49:
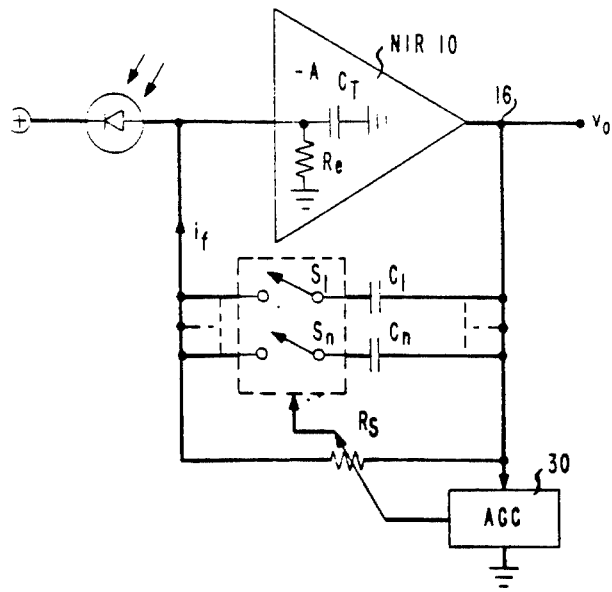
FIG. 49 shows how a variable $C_F$ can be achieved by a plurality of capacitor-switch combinations in parallel with $R_s$ with the switches under AGC control.

(2) Reduce the $R_s$-$C_T$ transimpedance feedback phase shift below 90 degrees above the signal bandwidth (FIGS. 47–49). This does not distort the signal response but does reduce the high frequency feedback phase shift.

(3) Reduce the gain ($A\beta_3$ or $A_1$) phase shift below 90 degrees (not shown).

The simplest solution to loop gain reduction is to operate the receiver amplifier of FIG. 40 as an input shunt amplifier ($\beta_3 = 0$) until $R_s$ is near its minimum. The $R_sC_T$ pole is then above the maximum $A\beta_3$ unity gain frequency, and the feedback voltage gain $\beta_3$ can be increased to extend the dynamic range to higher photocurrents. Thus, at low photocurrents, $R_s$ and $\beta_3$ are off; the latter prevents signal integration by feedback through the parasitic capacitance of $R_s$. At the shunt amplifier AGC threshold, $R_s$ but not $\beta_3$ is turned on. The voltage feedback $\beta_3$ is applied only as $R_s$ approaches its minimum, where also, if $R_s$ is a FET, the linear $v_d$-$i_d$ region is largest.

Figures 43, 44:
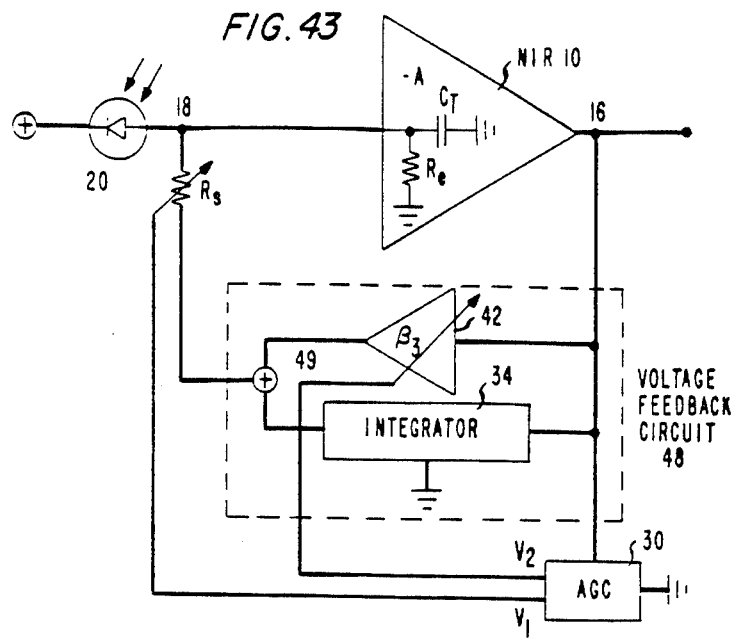
FIG. 43 is an embodiment of FIG. 40 in which stability is achieved by reducing the loop gain when the phase shift is near 180 degrees and which incorporates a slow integrator for supplying DC bias to the forward amplifier.
FIG. 44 is an embodiment of FIG. 43 incorporating a bipolar transistor feedback driver scheme.

FIG. 43 shows an adaptation to a single-ended gain element in which the required DC bias for $\beta_3=0$ is provided by a feedback integrator 34. The voltage feedback circuit 48 need not partition neatly into the blocks of FIG. 43, which indicates only that a high DC feedback gain is utilized, with a single-pole rolloff to a lower variable AC gain $\beta_3$. An embodiment of the receiver of FIG. 43 using a BJT current-division scheme is shown in FIG. 44.

The variable resistance device is depicted as a FET $Q_s$ having its drain connected to input terminal 18 and its gate coupled to one output $V_1$ of AGC circuit 30. The output terminal 16 drives AGC circuit 30 as well as a voltage feedback circuit 48. The latter typically includes a feedforward capacitor $C_{fd}$ connected between the output terminal and the base of a BJT $Q_3$ whose emitter is connected to the source of $Q_s$. BJT $Q_3$ corresponds to summing element 49 in FIG. 43. Circuit 48 also includes a current-division arrangement formed by BJTs $Q_1$ and $Q_2$. The emitters of $Q_1$ and $Q_2$ are connected through a resistor $R_1$ to the output terminal 16, the base of $Q_1$ is coupled to a bias voltage source, and the base of $Q_2$ is connected to a voltage divider ($R_4$-$R_5$) between the base of $Q_1$ and to the second output $V_2$ of AGC circuit 30. The collectors of $Q_1$ and $Q_2$ are connected to one another through a resistor $R_2$. In addition, the collector of $Q_1$ is connected to the base of $Q_3$, and the collector of $Q_2$ is connected both through a capacitor $C_i$ to AC ground and through a resistor $R_3$ to another bias voltage source.

All of the $Q_1$-$Q_2$ emitter current is integrated by $C_i$. However, the fraction that passes through $Q_1$ and hence $R_2$ to produce the AC feedback gain is controlled by the base voltage differential between $Q_1$ and $Q_2$ which is set by $V_2$. Note, the use of a feedforward capacitance $C_{fd}$ reduces the high frequency phase shift of element 42 (FIG. 43), thereby improving stability.

Figure 45:
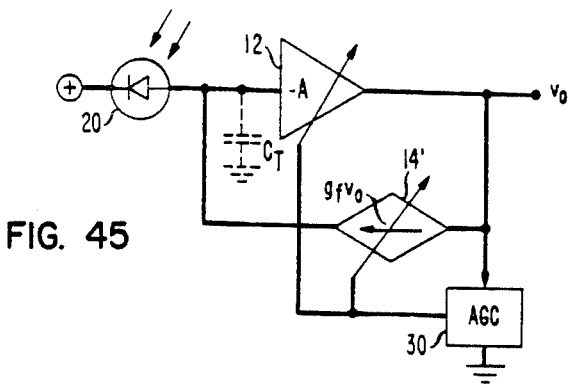
FIG. 45 is another embodiment in which stability is achieved by reducing the loop gain when the loop phase shift is near 360 degrees and which includes a tracking arrangement for simultaneously reducing the gain A and the feedback transconductance $g_f$.
Figure 46:
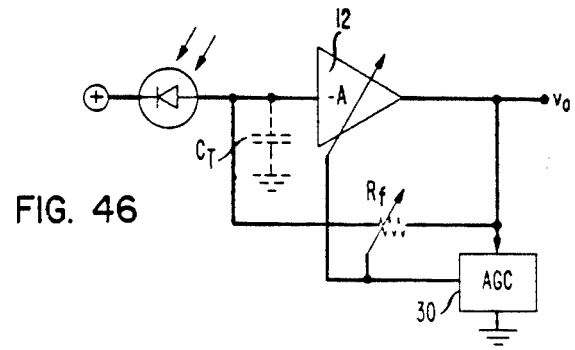
FIG. 46 shows another embodiment of FIG. 45 in which the current source of FIG. 45 is replaced by a variable resistance $R_s$.

Another loop gain reduction scheme, as shown in FIGS. 45 and 46, involves tracking the forward gain and the feedback transimpedance. In FIG. 45, the forward amplifier, which may be a conventional voltage amplifier or a NIR 10 in accordance with my invention, has a variable voltage gain $-A$. The feedback element is a voltage-controlled current source 14', of the type shown in FIG. 9, having a variable transconductance $g_f$. Both A and $g_f$ are controlled by an AGC circuit 30 responsive to the output voltage $v_o$. When the forward amplifier is a conventional voltage amplifier, the circuit of FIG. 45 as a whole is a NIR corresponding to FIG. 9. But, when the forward amplifier is itself a NIR 10, then current source 14' would be in parallel with current source 14 of FIG. 9. In FIG. 46 the current source is provided by $v_o$ driving a large variable resistance $R_f$.

More specifically, in reducing the loop gain, the AGC circuit increases $g_f=1/R_F$ while reducing A so that the equivalent input resistance $R_e=1/g_f(A+1)$ is roughly constant. For stability the unity loop gain frequency including the $R_eC_T$ rolloff should not increase to the pole frequency of the gain A. For proper frequency response, the unity voltage loop gain frequency should remain above the signal band to insure that the $R_eC_T$ transimpedance response pole remains above the signal band. Once $A \leqq 1$, the loop is unconditionally stable—the design then essentially reduces to a shunt amplifier. Note that this scheme, in principle, can provide full AGC with no AGC threshold, thus eliminating the need for an AGC post amplifier. Note also, the need for A and $g_f$ to track. The tracking precision required is set by the ratio of the signal bandwidth to the gain A bandwidth.

The second stability solution mentioned earlier is to reduce the $R_s$-$C_T$ transimpedance feedback phase shift at high frequencies. This phase shift may be reduced by adding a feedback capacitance $C_F$ across $R_s$ (FIGS. 41 and 47-50). $C_F$ adds a high frequency feedback zero at $R_sC_F$ which should be above the signal bandwidth for proper response but for stability should be below the dominant amplifier pole $f_a$ unless $C_F>0.1$ $C_T$. Above the zero frequency the voltage feedback is flat due to the $C_F$-$C_T$ divider action; the loop rolloff is due to the rolloff of the gain A. The lower frequency voltage feedback pole is at $\tau_p = R_s(C_T+C_F)$.

The simplest capacitive stabilization method is to add a fixed capacitor $C_F$ across $R_s$ (FIGS. 41 and 47). The zero-to-pole frequency ratio is then $(C_F+C_T)/C_F$. If this ratio is, say, 10:1, the maximum feedback phase shift is about 60 degrees, independent of $R_s$, and the transimpedance loop is stable. For $A=20$, $C_F$ gives a miller capacitance of $(A+1)C_F=2.1$ $C_T$. The low current feedback transconductance is then tripled to make up for this extra front-end miller capacitance, preserving the low current response.

If a larger gain A is needed for the low current feedback, this technique can be applied to the circuits of FIGS. 40 or 41. (The latter is shown explicity).

A second approach to reducing the feedback phase shift is to make $C_F$ effectively variable (FIG. 48) and to control both $C_F$ and $R_s$ with AGC circuit 30. If, as $R_s$ is decreased, $C_F$ is increased so that the $R_sC_F$ voltage feedback zero is lower in frequency than the amplifier pole, but above the desired transimpedance bandwidth, the loop is stable and the in-band frequency response is flat. Once $C_F$ reaches 0.1 $C_T$, the maximum feedback phase shift is about 60 degrees, the loop is stable, and $C_F$ need not be increased further. Typical methods for implementing a variable effective $C_F$ include the following methods and combinations thereof:

(a) Switched feedback capacitors across $R_s$. As shown in FIG. 49, a switch $S_i$ is connected in series with a capacitor $C_i(i=1,2 \ldots n)$, and a plurality n of such switch-capacitor series combinations are connected in parallel with variable resistor $R_s$. Typically $C_i$ are graded in value such that $C_{i+1}>C_i$ and are sequentially connected in parallel with $R_s$ under the control of AGC circuit 30 which sequentially closes switches $S_i$. Of course, the switches $S_i$ may be semiconductor devices. This embodiment, however, does increase the total input capacitance by typically 0.1 $C_T$. In operation, the feedback phase shift is reduced by varying the number of capacitors $C_i$ connected in parallel with $R_s$ and thereby varying the imaginary component of the feedback current $i_f$. For a nonintegrating response the feedback zero at $R_s\Sigma C_i$ should be above the bandwidth, but for stability that zero should be less than $f_a$.

Figure 50:
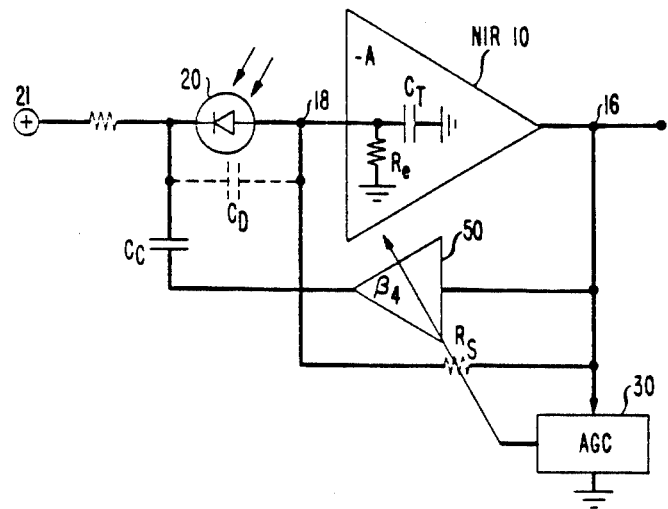
FIG. 50 shows how the compensation of FIG. 47 can be achieved using the photodiode capacitance $C_D$.

(b) Variable gain feedback to the bias side of photodiode 20, resulting in compensation via the photodiode capacitance $C_D$. As shown in FIG. 50, $R_s$ and the AGC circuit 30 are connected as before. However, a feedback element 50 having a variable gain $\beta_4<1$ has its input connected to output terminal 16 and its output connected through an AC coupling capacitor $C_C$ to a node between the reverse bias source 21 and the photodiode 20. This connection effectively places the photodiode capacitance $C_D$ in parallel with $R_s$. Although $C_D$ is relatively constant, the AC feedback voltage across the photodiode varies with $\beta_4$, thereby changing the imaginary part of the feedback current and the feedback phase shift. Because the required gain $\beta_4$ is typically less than unity, the bandwidth of $\beta_4$ can exceed the gain-bandwidth product of the technology. Alternatively, one can use switched capacitors to the bias side of the diode analogous to the approach described in paragraph (a). Both techniques (a) and (b) can be used with a regular capacitor replacing $C_D$.

(c) If a ladder of feedback FETs is used (see the following discussion and FIG. 51), some $C_F$ variation may be achieved by AC grounding gates of OFF transistors and allowing gates of ON transistors to AC float. Alternatively, the gates of the ON FETs may be AC coupled to the output. The latter arrangement produces capacitive coupling from source to drain only in the ON FETs, producing a $C_F$ which increases stepwise as $R_s$ decreases.

Again, if a large gain is required for the low current feedback, these techniques can be applied to the circuits of FIGS. 40 and 41.

Note that for a forward amplifier bandwidth much greater than the signal bandwidth, the tracking requirement on $R_s$ and $C_F$ is lenient. In the best case only one change may be required in $C_F$—the circuitry discussed above is then simplified.

A final capacitive compensation feedback phase reduction technique is to apply to $C_F$ a voltage feedback which is still in-band, increases above the bandwidth, and becomes constant below the amplifier pole. This reduces the in-band miller capacitance effect. Again, a forward amplifier bandwidth greater than the signal bandwidth is required.

The third instability solution mentioned earlier is to reduce the $A\beta_3$ gain phase shift of FIG. 40 by introducing zeropole pairs into the (original) single pole rolloff. Available methods include feedforward compensation (typically buffered to avoid miller positive feedback), capacitive pole splitting, and possibly introducing an extra zero-pole combination in $\beta_3$; given $\beta_3 < 1$, $\beta_3$ is the widest bandwidth stage.

These stabilization techniques, and/or combinations thereof, may make possible an AGC threshold equal to the sensitivity level.

In the embodiments discussed so far, the variable feedback resistance $R_s$ has tacitly been assumed to be a single FET $Q_s$. However, if a single feedback FET is used, its maximum size and hence its conductivity is limited by two turn-on effects. First, the FET channel is a resistive line shunted to ground along its length by the capacitance $C_s$ to the (AC grounded) gate. This forms an ideal R-C phase shifter. To avoid possible response peaking or oscillation at turn-on, the size of $Q_s$ should be scaled down so that the low current feedback equivalent resistance $R_e$ is dominant until $R_s$ is small enough so that the $R_s$-$C_s$ delay line phase shift is negligible within the passband and is tolerable below the unity gain frequency. Secondly, the linear FET $i_d$-$v_d$ region is small at high $R_s$. Again the FET size should be scaled down so that $R_e$ is dominant until the FET resistance is linear over the output voltage swing. These effects combine to limit the AGC dynamic range (typically to less than 30:1 at 45 Mb/s). Both effects are avoided, however, when variable feedback gain is used.

Figure 51:
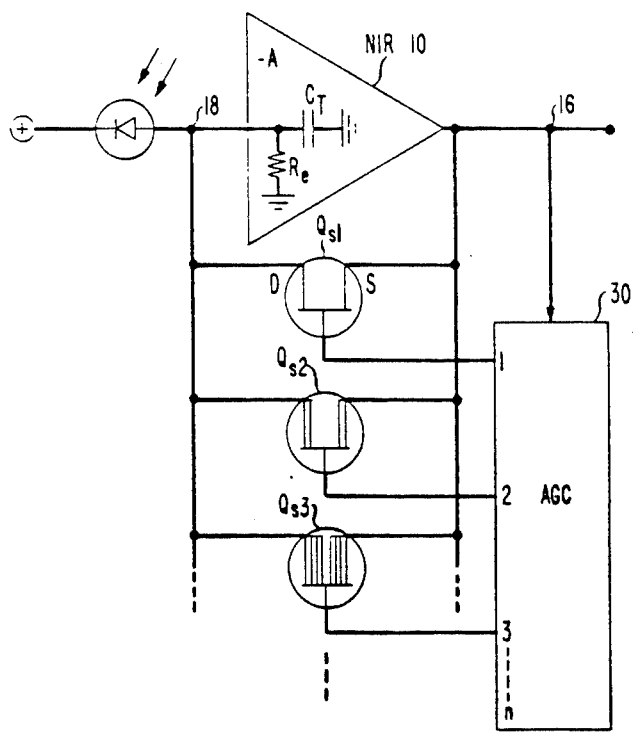
FIG. 51 is an embodiment of my invention in which the variable resistor is implemented by a plurality of different size FETs connected in parallel.

To extend the dynamic range, multiple feedback FETs may be used. As shown in FIG. 51, a plurality of FETs $Q_{si}$ ($i=1,2,3\ldots$) have their drains connected to input terminal 18, their sources connected to output terminal 16, and their gates connected to separate ones of a plurality of outputs of AGC circuit 30. In physical size $Q_{si}$ is smaller than $Q_{s(i+1)}$. Although the turn-on nonlinearities of each FET are masked by the feedback already present, the arrangement is relatively complex. However, for IC versions the total capacitance (sensitivity) penalty should be comparable to that of a single large feedback FET of the same area, hence of the same current capacity. Alternatively, the distributed gate feedback transistor idea of section III(c) may be used. As discussed there, it cures both the nonlinearity and the capacitance effects. The related discretized gate versions also are applicable.

It is to be understood that the above-mentioned arrangements are merely illustrative of the many possible specific embodiments which can be devised to represent application of the principles of the invention. Numerous and varied other arrangements can be devised in accordance with these principles by those skilled in the art without departing from the spirit and scope of the invention as set forth in the appended claims. In addition, the parenthetical references to figure numbers in the claims are included for convenience only and shall not be construed as limiting the scope of any claim to read only on the figures so identified.

Moreover, it will be appreciated by those skilled in the art that my nonintegrating receiver, both with and without range extension, when used in a digital system, would typically be used in conjunction with other well-known equipment, e.g., a clock recovery circuit for synchronous digital transmission and a sampling/decision circuit for reconstructing the digital signal.

EXAMPLE

The HIC receiver mentioned in section IV(b) was designed as follows. The NIR 10 comprised the circuit of FIG. 15 with the following component values:

| Ref. No. | Component Values | |
|---|---|---|
| 12.1 | $g_m = 28$ mS; | $C_g = .5$ pF |
| 12.2 | $\beta = 40$–200; | $f_T = 5$ GHz |
| 12.3 | $\beta = 40$–200; | $f_T = 5$ GHz |
| 24.1 | $\beta = 100$–300; | $f_T = 300$ MHz |
| D | $C_D = .6$ pF; | |
| $P_C = 100$ k$\Omega$, bypassed by Si diode to carry photocurrents greater than 7 $\mu$A | | |
| $R_F = 1$ M$\Omega$ | | |
| $R_d = 220$ $\Omega$ | | |
| $R_{b3} = 470$ $\Omega$ | | |
| $R_{e3} = 470$ $\Omega$ | | |
| $R_{c2} = 1$ k$\Omega$ | | |
| $R_{c1} = 2.05$ k$\Omega$ | | |
| $R_1 = 100$ $\Omega$ | | |
| $C_c = .01$ $\mu$F | | |
| $C_A = .8$ pF (includes $C_q$ of 12.1 above) | | |
| $C_1 = 0.1$ $\mu$F | | |
| $C_2 = .068$ $\mu$F | | |
| $C_f = 470$ pF | | |
| $V_{dd} = $ output of drain bias integrator 36 (FIG. 39) | | |
| $V_2 = $ output $V_2$ of AGC 30 (FIG. 39) | | |
| $V_3 = +5$ V | | |
| $V_4 = +5$ V | | |
| $V_5 = -5$ V | | |
| $V_6 = +5$ V | | |
| $V_7 = -1.6$ V | | |

The FET 12.1 was a GaAs MESFET and the photodiode D was an InGaAs p-i-n diode. The total leakage current of these two devices plus $Q_s$ (see below) was 38 nA. Shielding and power supply filtering (not shown) were employed for noise reduction.

The range extender embodiment employed with the above NIR 10 is shown in FIG. 39 wherein current source 14 of FIG. 39 comprises $R_F$, $C_D$, $C_C$ and feedback integrator 24 of FIG. 15. The additional components of FIG. 39 had the following values:

| Ref. No. | Component Value |
|---|---|
| $Q_s$ | $l_1 < 10$ nA (off); $R_{sd}$(min) = 12.8 Ω |
| 34 | $f_T = 8.33$ Hz (unity gain) |
| | $V_8 = -2$ V to 0 V, servoes $v_o$ to be $-2.3$ V. |
| 36 | $f_T = 500$ Hz |
| | $V_{dd} = +5$ V to $+.8$ V |
| | $V_r = -1.8$ V |
| 30 | $V_1 = -5$ V to $V_8 + .6$ V |
| | $V_2 = .9$ V to $-.7$ V |
| | $f_{T1} = f_{T2} = 8.33$ Hz |

The FET $Q_s$ was a GaAs MESFET, and the AGC circuit 30 was of a well-known design including a peak-to-peak detector followed by a pair of integrators with different thresholds for providing $V_1$ and $V_2$. The integrator outputs were filtered for noise reduction; the impedance of the $V_1$ filter in combination with the $Q_s$ gate-to-source diode characteristic provided the $V_1$ positive limit. A conventional fixed gain post amplifier stage was used to drive both the AGC peak-to-peak detector and a conventional AGC post amplifier/digital regenerator board.

As mentioned earlier, this receiver had a simulated dynamic range of 52 dB (optical) and a $-50$ dBm optical sensitivity at 1.3 μM and 44.7 Mb/s.

What is claimed is:

1. Apparatus (FIGS. 9, 12, 33/40) for amplifying a NRZ digital optical signal having a bit rate B and bandwidth Δf comprising:

a nonintegrating receiver having an input capacitance $C_T$ and including:

a photodiode for receiving said signal and converting it to an electrical current $i_s$, an input terminal to which said electrical current is applied and an output terminal at which an amplified output voltage $v_o$ appears, a voltage amplifier connected between said terminals, said amplifier having a forward voltage gain $(-A)$ with poles therein at a frequencies $f_{ai}$ outside Δf, and a negative feedback circuit, connected between said terminals, including a current source for generating a feedback current $i_f$ which is proportional to $v_o$, said current source having a transconductance $g_f$ which is of opposite sign to A and comprising a voltage integrator having its input connected to said output terminal and having a pole in its transfer function at a frequency $f_i$, and a parallel combination of a feedback resistor $R_F$ and a feedback capacitance $C_F$ connected between said input terminal and the output of said integrator, said combination having a zero in its transfer function at $f_i$ so that said transconductance $g_f$ is essentially constant with frequency within Δf, the output voltage $v_f$ of said integrator being related to $v_o$, in the frequency domain, by the relationship $v_f = av_o/(s + 2\pi f_i)$, the equivalent input conductance $g_e$ of said amplifier being given by $g_e = 1/Ag_f$, and for said receiver to be nonintegrating $Aa > 2\pi C_T 0.56B/C_F$, said feedback circuit in combination with $C_T$ producing a feedback voltage gain β with a feedback pole therein at a frequency $f_f$ within Δf, and said amplifier and said feedback circuit forming a loop circuit having a loop gain Aβ, and for stability said feedback circuit pole being the dominant pole in Aβ versus frequency, and a range extender for preventing the saturation of said receiver at high amplitudes of $i_s$ including a variable resistor $R_s$ having one end connected to said input terminal, and an automatic gain control (AGC) circuit responsive to said optical signal for decreasing $R_s$ when $i_s$ reaches said high amplitudes, said AGC circuit having a threshold below which the output voltage of said amplifier increases with increasing current and above which said output voltage is essentially constant, and said variable resistor has a high resistance $R_{s2}$ below said threshold and a lower variable resistance $R_{s1}$ above said threshold.

2. The apparatus of claim 1 wherein the other end of $R_s$ is AC grounded.

3. Apparatus (FIGS. 9, 16, 33-40) for amplifying a NRZ digital optical signal having a bit rate B and bandwidth Δf comprising:

a nonintegrating receiver having an input capacitance $C_T$ including a photodiode for receiving said signal and converting it to an electrical current $i_s$, an input terminal to which said electrical current is applied and an output terminal at which an amplified output voltage $v_o$ appears, a voltage amplifier connected between said terminals, said amplifier having a forward voltage gain $(-A)$ with poles therein at a frequencies $f_p$ outside Δf, and a negative feedback circuit, connected between said terminals, including a current source for generating a feedback current $i_f$ which is proportional to $v_o$ and which is subtracted from $i_s$ at said input terminal, the transconductance $g_f$ of said current source being essentially independent of frequency within Δf and of opposite sign to A, said current source comprising a field effect transistor $Q_F$ having a source and drain, a channel coupling said source to said drain, and a gate for controlling the flow of current from said source to said drain through said channel, said source and drain being connected between said input and output terminals, and including means for biasing $Q_F$ into the linear region of its current-voltage characteristic, said transistor having a source-to-drain conductance $g_{sd}$ and capacitance $C_{sd}$ where, for said receiver to be nonintegrating, $$A \geq 2\pi C_T 0.56B/g_{sd}$$

and $$C_{sd} \leq g_{sd}/2\pi B$$

said feedback circuit in combination with $C_T$ producing a feedback voltage gain $\beta$ with a feedback pole therein a frequency $f_f$ within $\Delta f$, and said amplifier and said feedback circuit forming a loop circuit having a loop gain $A\beta$, and for stability said feedback circuit pole being the dominant pole in $A\beta$ versus frequency, a range extender for preventing the saturation of said receiver at high amplitudes of $i_s$ including a variable resistor $R_s$ having one end connected to said input terminal, and an automatic gain control (AGC) circuit responsive to said optical signal for decreasing $R_s$ when $i_s$ reaches said high amplitudes, said amplifier having an equivalent input resistance $R_e = 1/g_e$, said AGC circuit having a threshold below which the output voltage of said amplifier increases with increasing current and above which said output voltage is essentially constant, and said variable resistor has a high resistance $R_{s2}$ below said threshold and a lower variable resistance $R_{s1}$ above said threshold.

4. The apparatus of claim 3 wherein the other end of $R_s$ is AC grounded.

* * * * *

UNITED STATES PATENT AND TRADEMARK OFFICE
CERTIFICATE OF CORRECTION

PATENT NO. : 4,574,249
DATED : March 4, 1986
INVENTOR(S) : Gareth F. Williams

It is certified that error appears in the above-identified patent and that said Letters Patent is hereby corrected as shown below:

Column 5, line 13, "$R_{CI}C_{Cr}$" should read --$R_{CI}C_I$--.

Column 8, line 22, "current" should read --<u>current</u>--.

Column 8, line 23, "voltage" should read --<u>voltage</u>--.

Column 9, line 49, "≈" should read --=--.

Column 10, line 37, "$\pi_I$" should read --$\tau_I$--.

Column 11, line 22, "$V_t$" should read --$V_T$--.

Column 11, line 30, "infra" should read --<u>infra</u>--.

Column 12, line 5, "low–$f_{fT}$" should read --low-$f_T$--.

Column 12, line 40, "{$V_{gs}, \Delta V_{gc}$" should read --$\Delta V_{gs}, \Delta V_{gc}$--.

Column 14, line 11, "transconductive" should read --transconductance--.

Column 19, line 30, "$V_s$" should read --$R_s$--.

Column 26, line 51, "$P_c$" should read --$R_c$--.

UNITED STATES PATENT AND TRADEMARK OFFICE
CERTIFICATE OF CORRECTION

PATENT NO. : 4,574,249

DATED : March 4, 1986

INVENTOR(S) : Gareth F. Williams

It is certified that error appears in the above-identified patent and that said Letters Patent is hereby corrected as shown below:

Column 19, line 30, "$V_s$" should read --$R_s$--.

Column 26, line 51, "$P_c$" should read --$R_c$--.

Signed and Sealed this

Twenty-first Day of February, 1989

Attest:

DONALD J. QUIGG

Attesting Officer

Commissioner of Patents and Trademarks